(12) United States Patent
Yun

(10) Patent No.: US 6,927,105 B2
(45) Date of Patent: Aug. 9, 2005

(54) THIN FILM TRANSISTOR ARRAY SUBSTRATE AND MANUFACTURING METHOD THEREOF

(75) Inventor: Hae Jin Yun, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 51 days.

(21) Appl. No.: 10/643,963

(22) Filed: Aug. 20, 2003

(65) Prior Publication Data

US 2004/0036070 A1 Feb. 26, 2004

Related U.S. Application Data

(62) Division of application No. 10/274,879, filed on Oct. 22, 2002, now Pat. No. 6,642,580.

(30) Foreign Application Priority Data

Apr. 17, 2002 (KR) ..................................... P2002-21057

(51) Int. Cl.$^7$ ............................................... H01L 21/00
(52) U.S. Cl. ...................... 438/152; 438/155; 438/161; 438/164
(58) Field of Search ................................ 438/152, 155, 438/161, 164, 30

(56) References Cited

U.S. PATENT DOCUMENTS

2002/0180898 A1 * 12/2002 Yoo et al. ..................... 349/43

* cited by examiner

*Primary Examiner*—Hsien-Ming Lee
(74) *Attorney, Agent, or Firm*—McKenna Long & Aldridge LLP

(57) ABSTRACT

A thin film transistor array substrate, and manufacturing methods thereof, having a dual data link structure comprised of a first data link made from a gate metal layer and of a second data link made from a transparent conductive layer. A gate pad made from the gate metal layer electrically connects directly with the first data link, and to the second data link via a data pad protection electrode that passes through contact holes. The data pad protection electrode makes surface connections to the data pad. A data line is electrically connected via a contact electrode to the first data link. The data line and the data pad are formed from different metal layers. The data pad is protected by a gate insulating layer. The contact electrode is extended from the second data link.

7 Claims, 23 Drawing Sheets

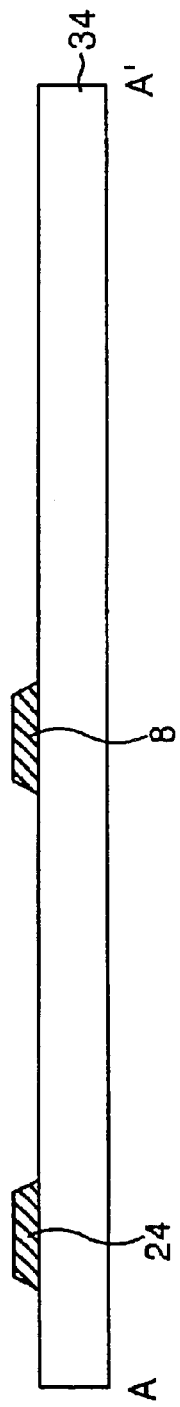
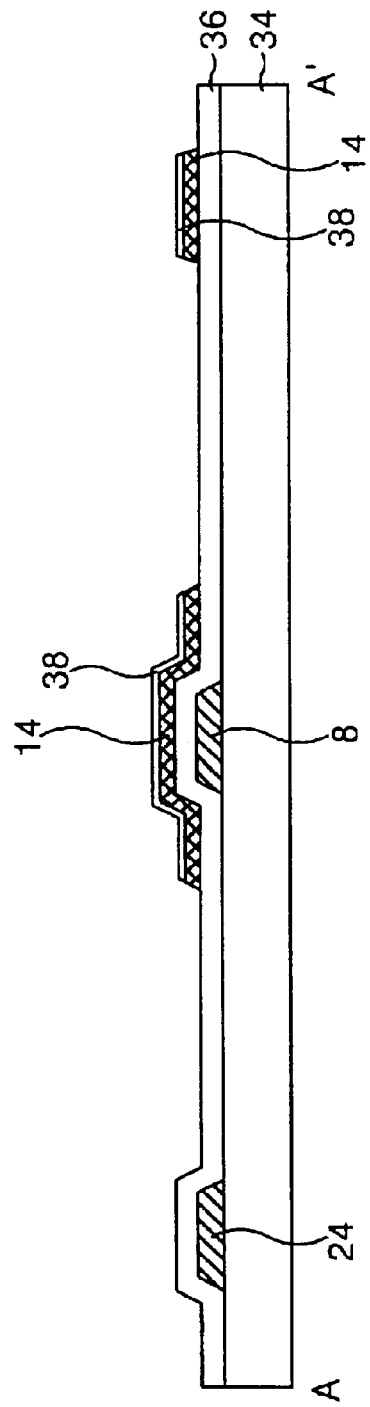
FIG.3A
CONVENTIONAL ART
FIG.3B
CONVENTIONAL ART

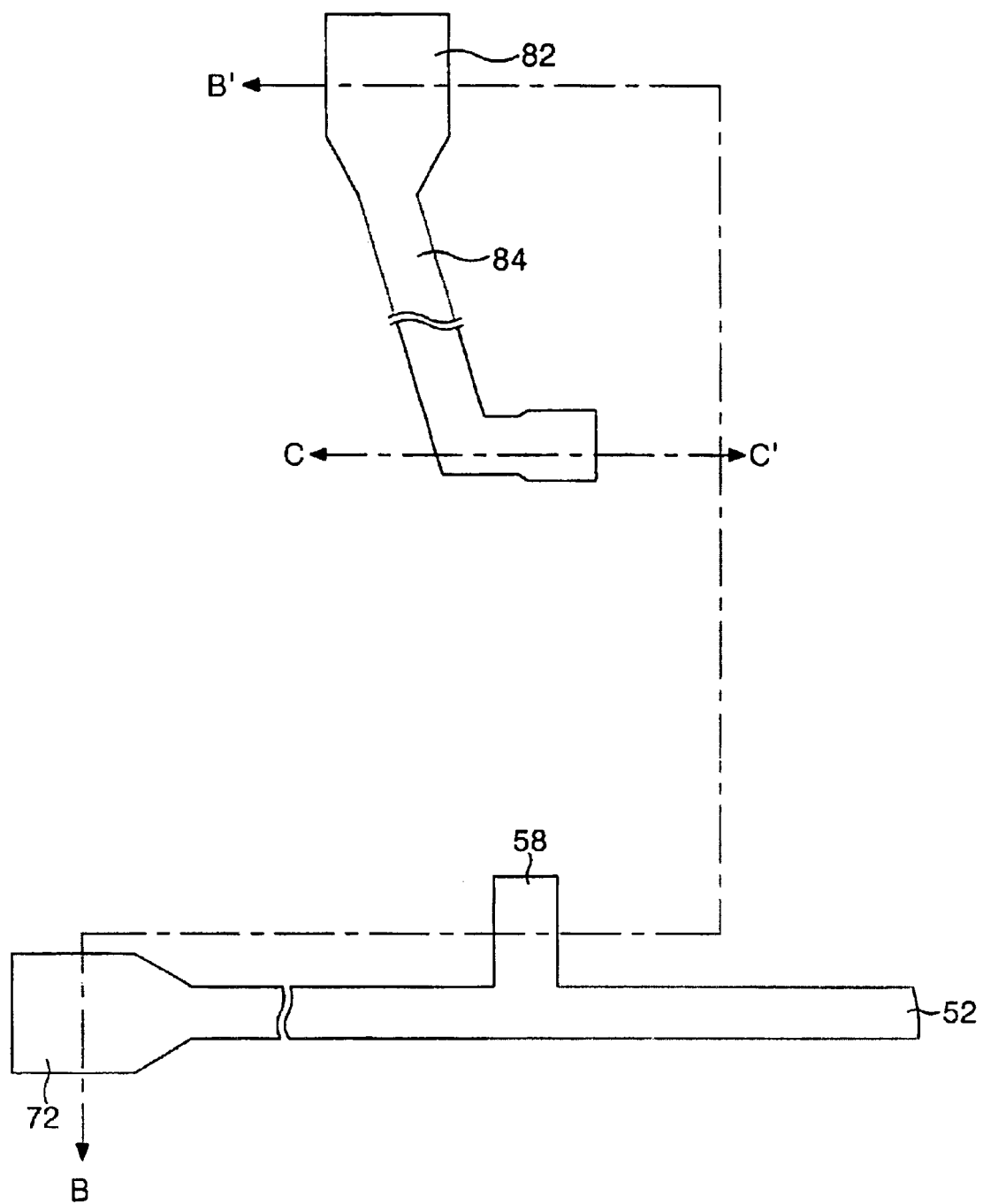

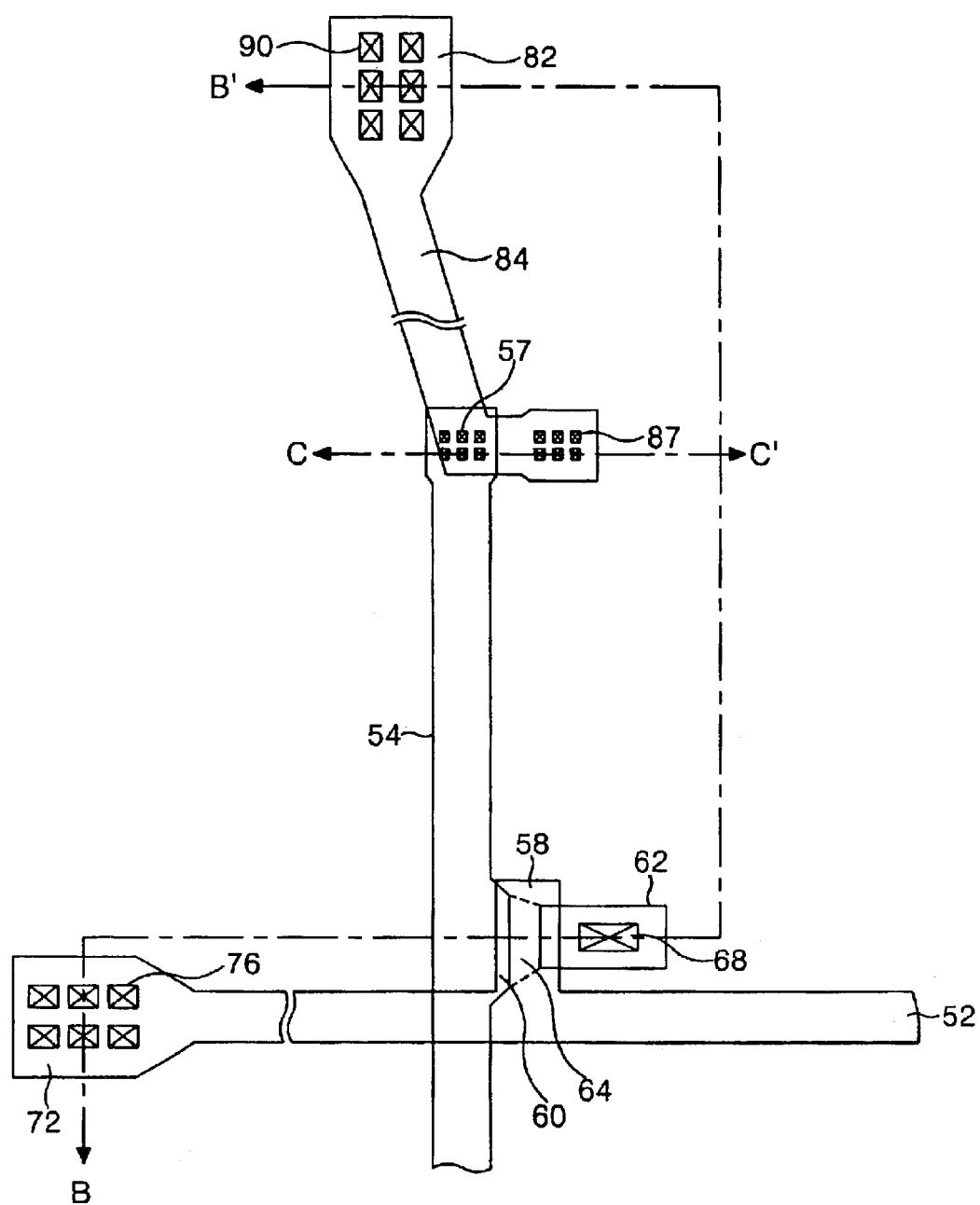

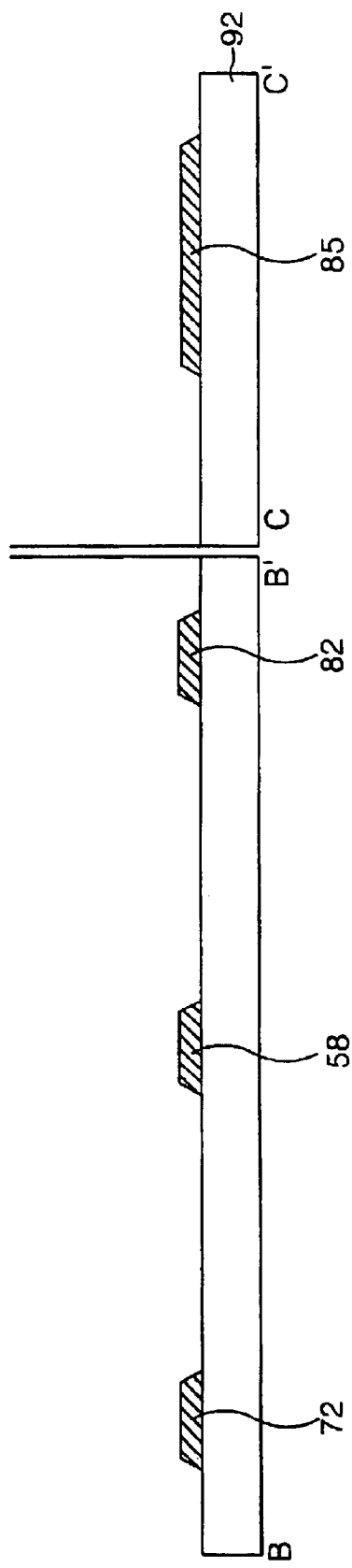
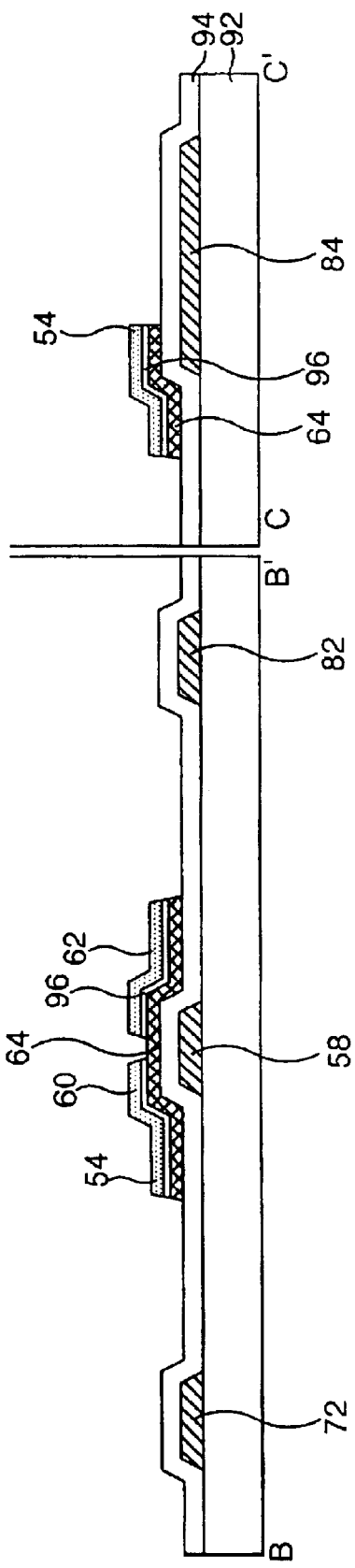
FIG.7A
FIG.7B

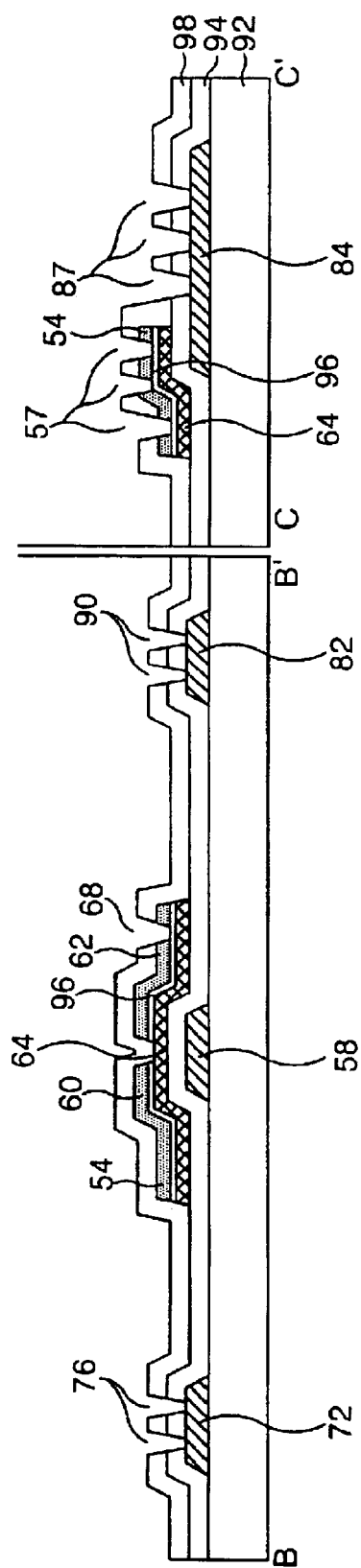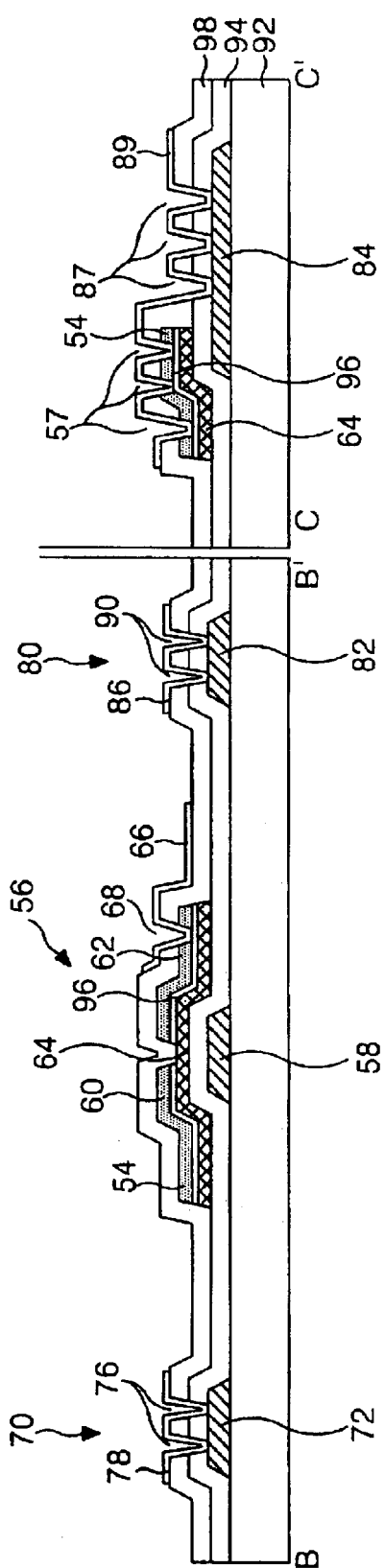

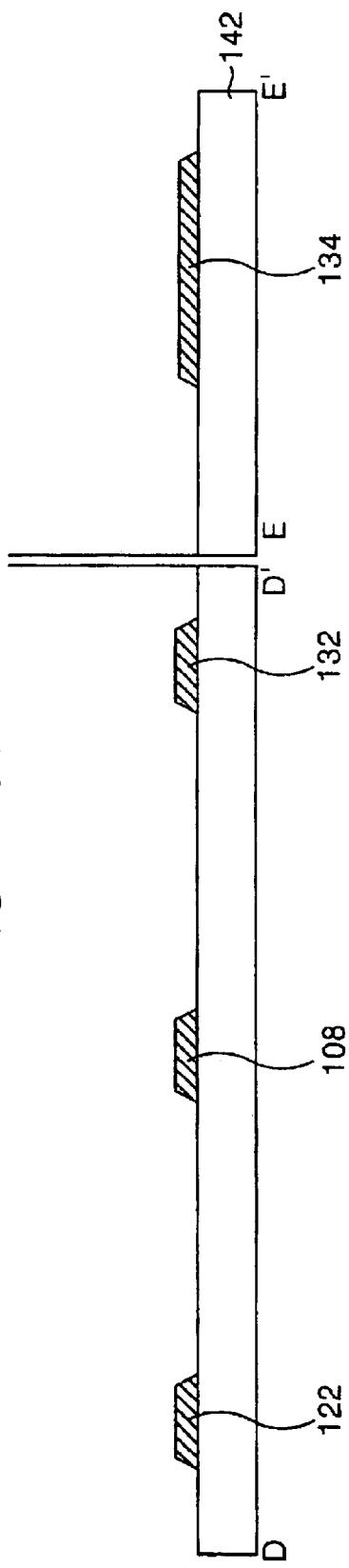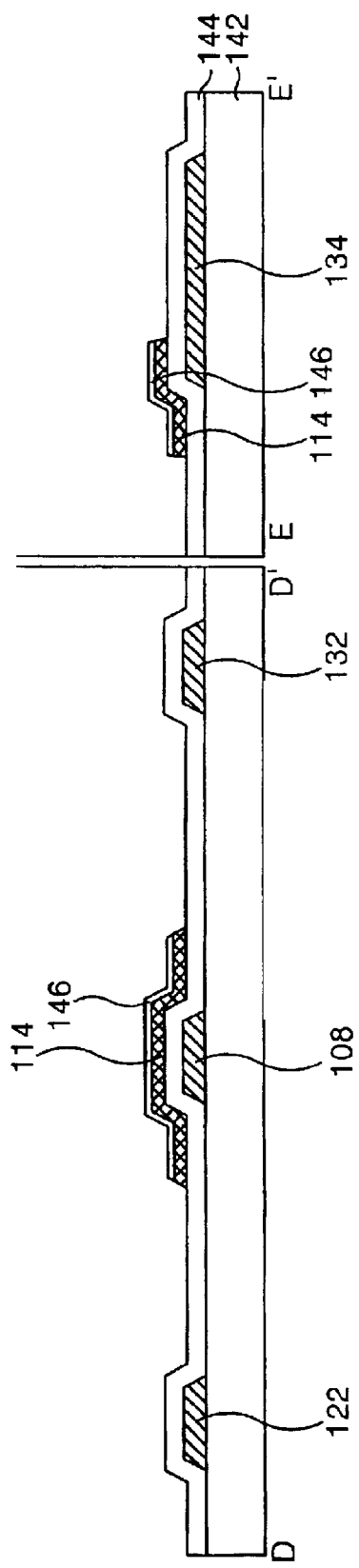

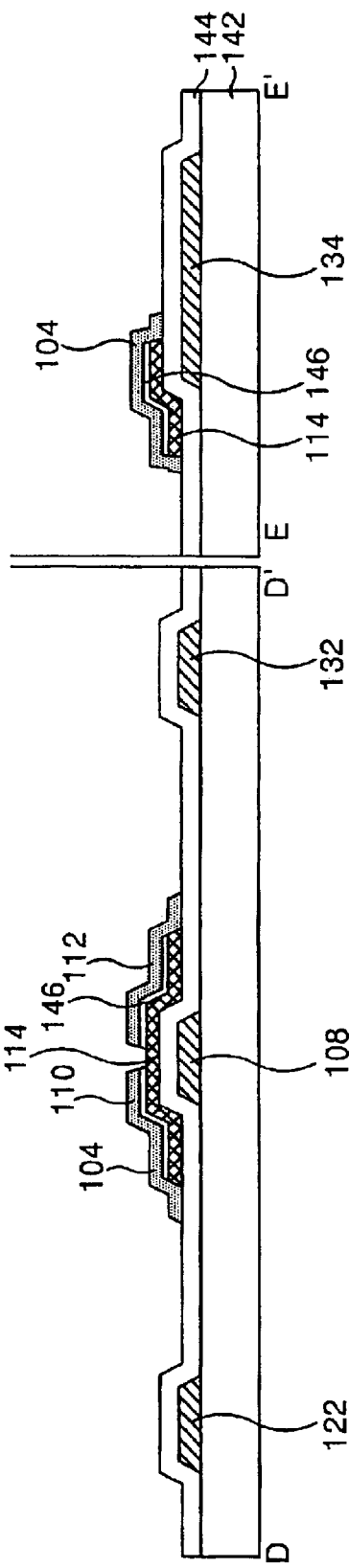
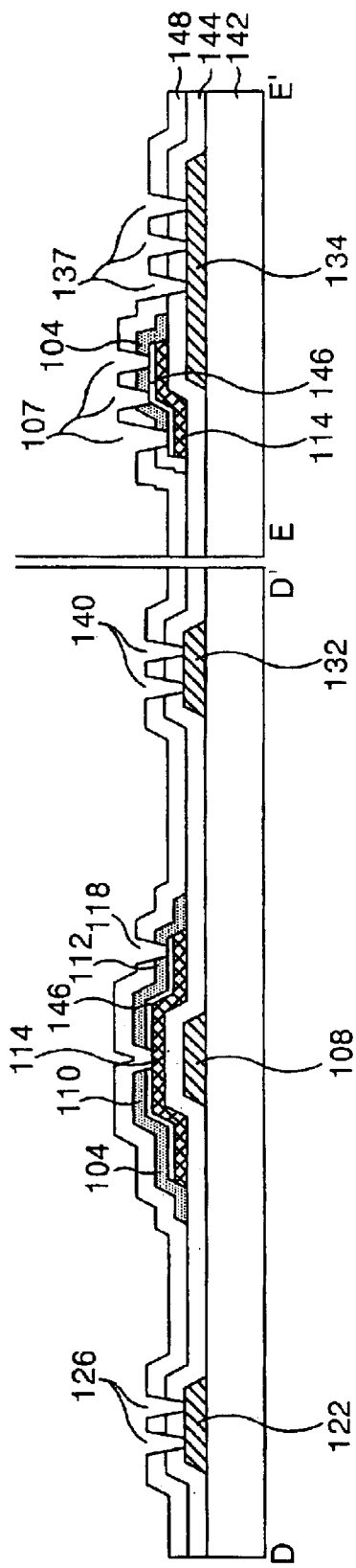

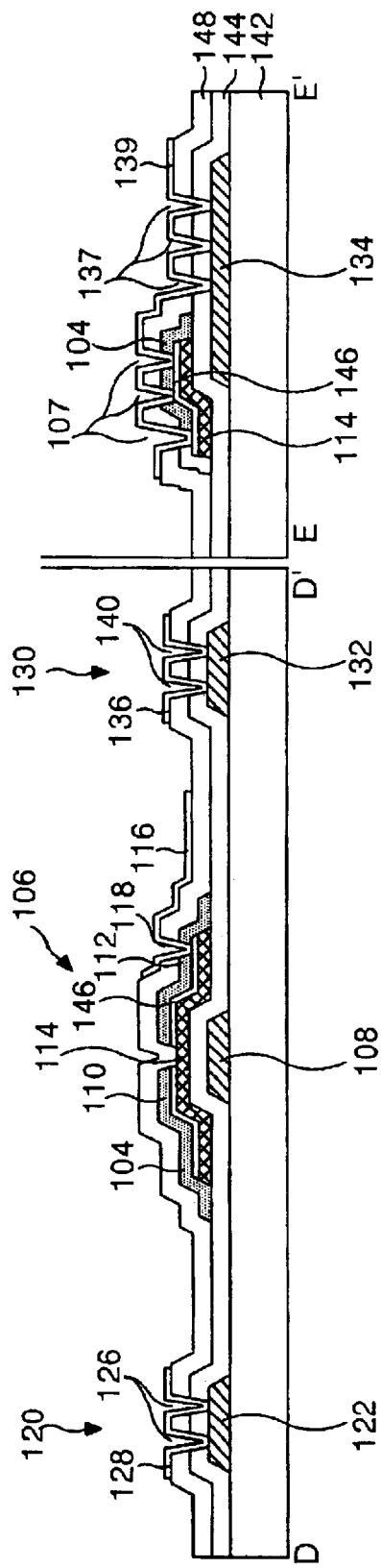

THIN FILM TRANSISTOR ARRAY SUBSTRATE AND MANUFACTURING METHOD THEREOF

This application is a divisional of prior application Ser. No. 10/274,879 filed Oct. 22, 2002 now U.S. Pat. No. 6,642,580.

BACKGROUND OF THE INVENTION

1. Field of the Invention

This invention relates to thin film transistor array substrates. More particularly, this invention relates to thin film transistor array substrates, and to their manufacturing methods, having reduced data pad and data link contact resistances.

2. Description of the Related Art

A liquid crystal display (LCD) uses electric fields to control the light transmittance through a liquid crystal to produce an image. To this end, an LCD includes a liquid crystal display panel having a matrix of liquid crystal cells, and driving circuits for driving the liquid crystal cells.

In a liquid crystal display panel, gate lines and data lines are arranged in a crossing manner. Liquid crystal cells are formed in areas defined by the crossing gate and data lines. The liquid crystal display panel includes pixel electrodes and a common electrode for producing electric fields from the liquid crystal cells. Each pixel electrode is selectively connected, via source and drain electrodes of a thin film transistor that acts as a switching device, to a data line. The gate electrode of each thin film transistor is connected to a gate line. Scanning signals applied on the gate lines switch pixel voltage signals on the data lines to the pixel electrodes.

The driving circuits include a gate driver for driving the gate lines, a data driver for driving the data lines, and a common voltage generator for driving the common electrode. The gate driver sequentially applies scanning signals to the gate lines to sequentially drive the liquid crystal cells line-by-line. The data driver applies data voltage signals (also referred to as pixel voltage signals) to the data lines when a scanning signal is applied to a gate line. The common voltage generator applies a common voltage to the common electrode. Accordingly, the LCD changes alignment states of the liquid crystal between the pixel electrodes and the common electrode in response to the pixel voltage signals on the pixels to control light transmittance, thereby displaying a picture.

For instance, an LCD having a thin film transistor array substrate is shown in FIG. 1. FIG. 2 shows a sectional view of the thin film transistor array substrate of FIG. 1 taken along line A–A'. As shown in those figures, the thin film transistor array substrate includes a gate line 2 and a data line 4 on a lower substrate 34. The gate and data lines 2 and 4 cross each other. A gate insulating film 36 is disposed between the gate and data lines 2 and 4. A thin film transistor 6 is provided at the intersection of the gate and data lines 2 and 4. A pixel electrode 16 is provided at a liquid crystal cell area defined by the gate and data lines 2 and 4.

The thin film transistor 6 includes a gate electrode 8 that is connected to the gate line 2, a source electrode 10 that is connected to the data line 4, a drain electrode 12 that is connected to the pixel electrode 16, and an active layer 14 that overlaps the gate electrode 8. The active layer selectively defines a channel between the source electrode 10 and the drain electrode 12. The active layer 14 is overlapped by the data line 4, by the source electrode 10, and by the drain electrode 12. An ohmic contact layer 38 for making an ohmic contact with the data line 4, with the source electrode 10, and with the drain electrode 12 is provided on the active layer 14. The thin film transistor 6 allows a pixel voltage signal applied to the data line 4 to be applied to the pixel electrode 16 in response to a gate signal applied to the gate electrode 8.

The pixel electrode 16 is electrically connected via a first contact hole 18 through a protective film 40 to the drain electrode 12. A voltage applied to the pixel electrode 16 and the potential applied to the common electrode on an upper substrate (not shown) produce an electric field. That electric field rotates a liquid crystal between the thin film transistor array substrate and the upper substrate owing to dielectric anisotropy. This controls the light from a light source (not shown) that passes to the upper substrate.

The gate line 2 is connected, via a gate pad portion 20, to a gate driver (not shown,), while the data line 4 is connected, via the data pad portion 28, to the data driver (not shown). The gate pad portion 20 is comprised of a gate pad 24 that is extended from the gate line 2, and a gate pad protection electrode 25 that is connected, via a plurality of second contact holes 26 through the gate insulating film 36 and through the protective film 40, to the gate pad 24. The data pad portion 28 is comprised of a data pad 30 that is extended by way of a data link 5 from the data line 4, and of a data pad protection electrode 31 that is connected, via a plurality of third contact holes 32 through the protective film 40, to the data pad 30.

Hereinafter, a method of fabricating the thin film transistor substrate having the above-mentioned structure using a five-round mask process will be described in detail with reference to FIG. 3A to FIG. 3E. Referring to FIG. 3A, gate patterns are provided on the lower substrate 34. To do so, a gate metal layer is formed on the lower substrate 34 by a deposition technique such as sputtering. Then, the gate metal layer is patterned by photolithography using a first mask and an etching to produce the gate patterns. A gate pattern includes the gate line 2, the gate electrode 8, and the gate pad 24. The gate metal is beneficially a single-layer or double-layer structure of chrome (Cr), molybdenum (Mo), or an aluminum group metal.

Referring to FIG. 3B, the gate insulating film 36, the active layer 14, and the ohmic contact layer 38 are then provided on the lower substrate 34 with the gate patterns. To do so, the gate insulating film 36, an amorphous silicon layer, and an $n^+$ amorphous silicon layer are sequentially provided by deposition techniques such as plasma enhanced chemical vapor deposition (PECVD) or sputtering. Then, the $n^+$ amorphous silicon layer and the amorphous silicon layer are simultaneously patterned by photolithography using a second mask and an etching process. The gate insulating film 36 is beneficially comprised of an inorganic insulating material such as silicon nitride ($SiN_x$) or silicon oxide ($SiO_x$).

Referring to FIG. 3C, source/drain patterns are then formed on the structure illustrated in FIG. 3B. To do so, a source/drain metal layer is formed using a deposition technique such as sputtering. Then, the source/drain metal layer is patterned by photolithography using a third mask and an etching process to form the source/drain patterns. Each source/drain pattern includes a data line 4, a source electrode 10, a drain electrode 12, and a data pad 30. Then, the ohmic contact layer 38 between the source electrode 10 and the drain electrode 12 is removed by a dry etching. This separates the source electrode 10 and the drain electrode 12.

The source/drain metal is beneficially made from molybdenum (Mo), titanium (Ti), tantalum (Ta), a molybdenum alloy, or chrome (Cr).

Referring to FIG. 3D, a protective film 40 having contact holes 18, 26 and 32 is then formed on the structure shown in FIG. 3C. To do so, a protective film material is formed by a deposition technique such as plasma enhanced chemical vapor deposition (PECVD). The protective film material is then patterned by photolithography using a fourth mask and a dry etching process to define the first to third contact holes 18, 26 and 32. As shown, the first contact hole passes through the protective film 40 and through the data electrode to expose the ohmic contact layer 38. The second contact holes 26 pass through the protective film 40 and the gate insulating film 36 to expose the gate pad 24. The third contact holes 32 pass through the protective film 40 and through the data pad 30 to expose the ohmic contact layer. The protective film 40 is beneficially comprised of an inorganic material that is identical to that used to form the gate insulating film 36, or of an organic material having a small dielectric constant, such as an acrylic organic compound, BCB (benzocyclobutene), or PFCB (perfluorocyclobutane.

Referring to FIG. 3E, transparent electrode patterns are then provided on the protective film 40. To do so, a transparent electrode material is deposited onto the protective film 40 by a deposition technique such as sputtering. Then, the transparent electrode material is patterned by photolithography using a fifth mask and an etching process to provide the transparent electrode patterns, each of which includes a pixel electrode 16, a gate pad protection electrode 25, and a data pad protection electrode 31. As shown, the pixel electrode 16 is in side contact with the drain electrode 12 via the first contact hole 18, the gate pad protection electrode 25 is in surface contact with the gate pad 24 via the second contact holes 26, and the data pad protection electrode 31 is in side contact with the data pad 30 via the third contact holes 32. The transparent electrode material is formed from indium-tin-oxide (ITO), tin-oxide (TO), or indium-zinc-oxide (IZO).

In the described conventional method of manufacturing a thin film transistor array substrate, when molybdenum (Mo), which is easily dry etched, is used as the source/drain metal, the contact holes 18 and 32 are formed through the drain electrode 12 and through the data pad 30. Thus, the pixel electrode 16 and the data pad protection electrode 31 formed over the contact holes 18 and 32 are in side contact with the drain electrode 12 and with the data pad 30. As a result, since the side contact area is narrow, the contact resistance between the drain electrode 12 and the pixel electrode 16, and the contact resistance at the data pad portion 28, produce signal quality deterioration.

In the described thin film transistor array substrate, each data pad 30 is connected via a data link 5 to a data line 4. However, the data links 5 have different lengths in accord with their positions. This is because the data links 5 connect closely spaced data pads 30 to widely spaced data lines 4. The different data link lengthes produce link resistance differences that can cause distortion of the pixel voltage signals.

The above-mentioned thin film transistor array substrate also can be made using a four-round mask process. This beneficially reduces the number of manufacturing processes that are required. Typically, a four-round mask process uses a diffractive exposure mask to pattern the semiconductor layers (including the amorphous silicon layer and the n+ amorphous silicon layer) and the source/drain metal layer using a single mask.

More specifically, the semiconductor layer and the source/drain metal layer are disposed on a substrate. Then, a photo-resist pattern having different thicknesses in the source/drain pattern portion and in the channel portions is provided by photolithography using a mask having a diffractive exposing part. In particular, the photo-resist pattern formed by the diffractive exposing technique (in the channel portions) is thinner than the source/drain pattern portion. Subsequently, the substrate is patterned by a wet etching process. Then, the thinner photo-resist pattern is removed from the channel portion by an ashing process. Thereafter, the source/drain metal layer and the n+ amorphous silicon layer of the channel portion are etched by a dry etching process. A stripping process then removes the remaining photo-resist pattern.

In such a four-round mask process, when the photo-resist pattern of the channel portion is removed by-the ashing process, an accident can occur in which the photoresist pattern at the data pad portion is removed. Therefore, when the source/drain metal layer and the n+ amorphous silicon layer of the channel portion are etched by a dry etching process, the data pad is subject to removal. This can result in an open defect at the data pad portion.

SUMMARY OF THE INVENTION

Accordingly, it is an object of the present invention to provide a thin film transistor array substrate, and its manufacturing method, wherein the data pad is formed from a metal layer that is different than the source/drain patterns. This can reduce contact resistance.

A further object of the present invention is to provide a thin film transistor array substrate, and its manufacturing method, wherein the data link is formed from a double metal layer that reduces link resistance.

A still further object of the present invention is to provide a thin film transistor array substrate, and its manufacturing method, wherein the data pad is formed from a metal layer that is different than that of the source/drain patterns.

To achieve these and other objects of the invention, a thin film transistor array substrate according to one aspect of the present invention includes a pixel electrode in each liquid crystal cell; thin film transistors that are connected to the pixel electrodes; crossing gate lines and data lines that are connected to the thin film transistors; gate pad portions for electrically connecting to a gate driver; data pad portions for electrically connecting to a data driver; gate link portions connected between the gate pad portions and the gate lines; and data link portions connected between the data pad portions and the data lines. The data pad portions each include a data pad protection electrode and a data pad. The data link portions include a first data link that extends from the data pad, and a second data link that extends over the first data link. The first data link is formed from a metal layer that is different than that used to form the data line to which it will be electrically connected. That connection is via a contact electrode that extends from the second data link to the data line.

In the thin film transistor array substrate, the data pad and the first data link are formed from the same gate metal layer as the gate line. The data line is formed from the source/drain metal layer.

The contact electrode, the second data link, and the pixel electrode are formed from the same transparent conductive material.

The data pad protection electrode is in surface contact with the data pad via contact holes through the gate insulating film and through the protective film over the data pad.

The contact electrode is connected, via contact holes through the protective film, to the data line, and, via contact holes through the gate insulating film and the protective film, to the first data link.

A method of manufacturing a thin film transistor array substrate according to another aspect of the present invention includes forming a gate line and a data line that intersect each other with a gate insulating film therebetween, forming a thin film transistor near the intersection of said two lines, forming a gate link and a gate pad that extend from the gate line, forming a data pad provided at a different layer from the data line, and forming a first data link that extends from the data pad. Then, forming a protective film on the entire structure, and thereafter defining a plurality of contact holes through the protective film. Then, forming a pixel electrode that is connected via a first contact hole to the thin film transistor, a gate pad protection electrode that is connected via second contact holes to the gate pad, a data pad protection electrode that is connected via third contact holes to the data pad, a second data link extends along the first data link from the data pad protection electrode, and a contact electrode that extends from the second data link and that connect to the first data link and to the data line via fourth and fifth contact holes.

The method includes depositing a gate metal material onto the substrate and then patterning it to form a gate electrode of the thin film transistor, a gate line, a gate pad, a data pad and the first data link. Also, forming the gate insulating film; depositing a semiconductor material on the gate insulating film, and then patterning the semiconductor material to form an active layer and an ohmic contact layer of the thin film transistor. Also, depositing a source/drain metal material and patterning it to form source and drain electrodes of the thin film transistor and the data line.

Alternatively, the method depositing a gate metal material onto the substrate and then patterning it to form a gate electrode of the thin film transistor, a gate line, a gate pad, a data pad and the first data link. Then, forming the gate insulating film and depositing a semiconductor material and a source/drain metal material. Then, patterning the semiconductor material and the source/drain metal material to form an active layer, an ohmic contact layer, source and drain electrodes of the thin film transistor, and the data line.

In the method, the data pad protection electrode is formed in surface contact with the data pad via contact holes through the gate insulating film and through the protective film on the data pad. The contact electrode is connected, via contact holes through the data line and through the protective film, to the data line, while also being connected, via contact holes through the gate insulating film and through the protective film to the first data link.

BRIEF DESCRIPTION OF THE DRAWINGS

These and other objects of the invention will be apparent from the following detailed description of the embodiments of the present invention with reference to the accompanying drawings, in which:

FIG. 3A to FIG. 3E are sectional views that are helpful for illustrating a method of manufacturing the thin film transistor array substrate shown in FIG. 1 and in FIG. 2;

FIG. 6A to FIG. 6D are views that are helpful for illustrating a method of manufacturing the thin film transistor array substrate shown in FIG. 4;

FIG. 7A to FIG. 7D are sectional views that are helpful for illustrating a method of manufacturing the thin film transistor array substrate shown in FIG. 4;

FIG. 11A to FIG. 11E are sectional views that are helpful for illustrating a method of manufacturing the thin film transistor array substrate shown in FIG. 9.

DETAILED DESCRIPTION OF THE PREFERRED EMBODIMENT

Figure 1:
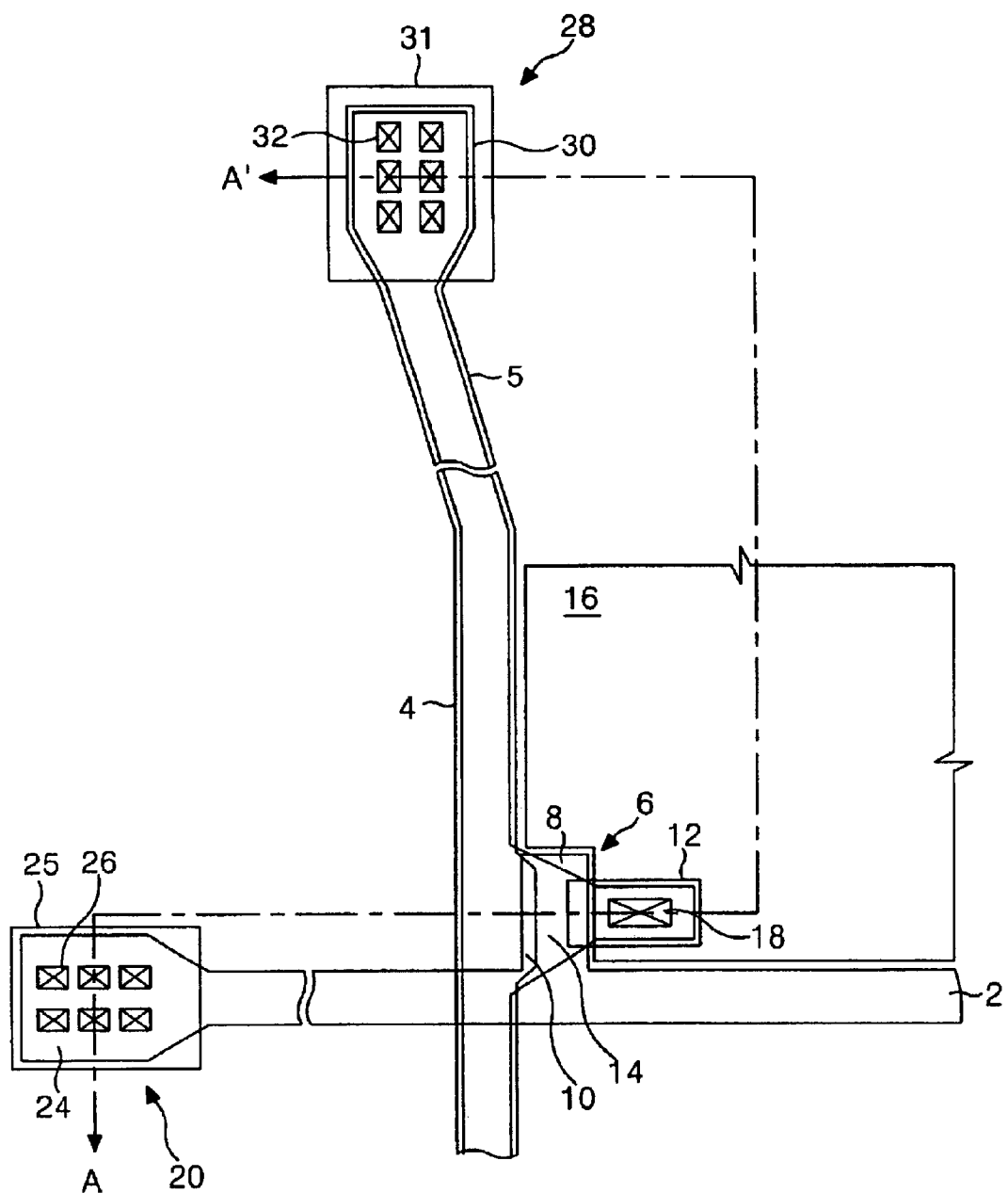
FIG. 1 is a plan view showing a portion of a thin film transistor array substrate of a conventional liquid crystal display.
Figure 2:
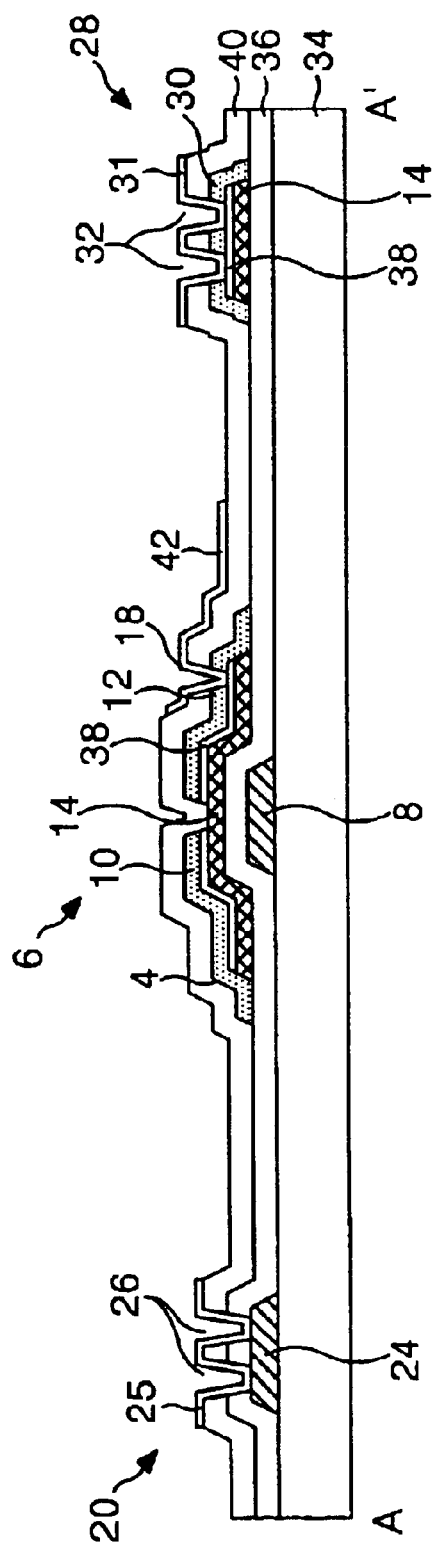
FIG. 2 is a sectional view of the thin film transistor array substrate of FIG. 1 taken along line A–A'.
Figure 3C:
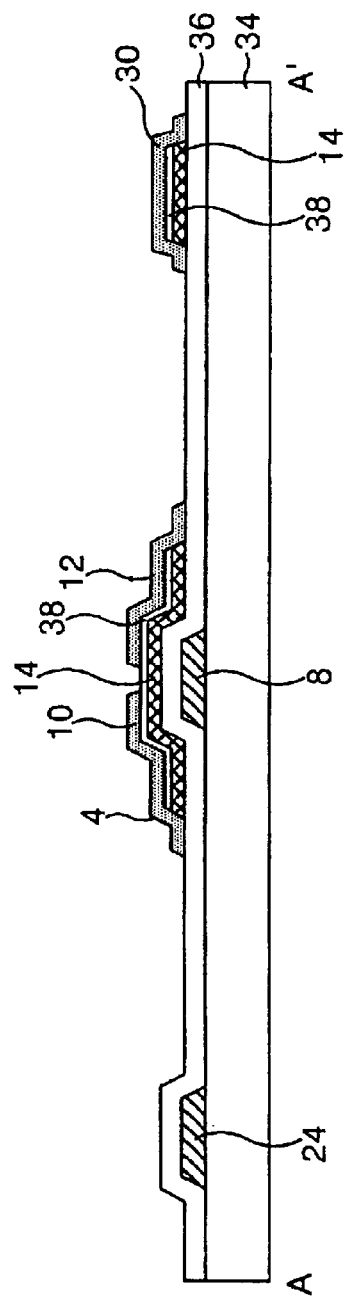
Figure 3D:
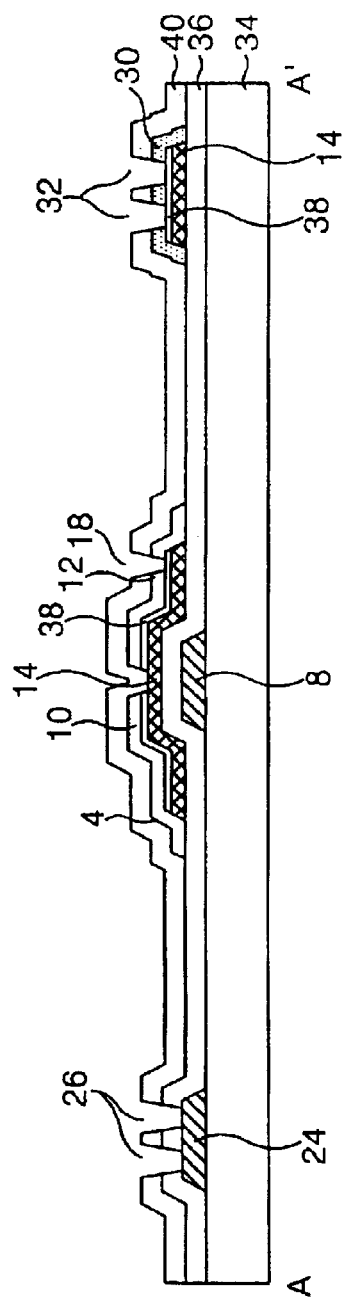
Figure 3E:
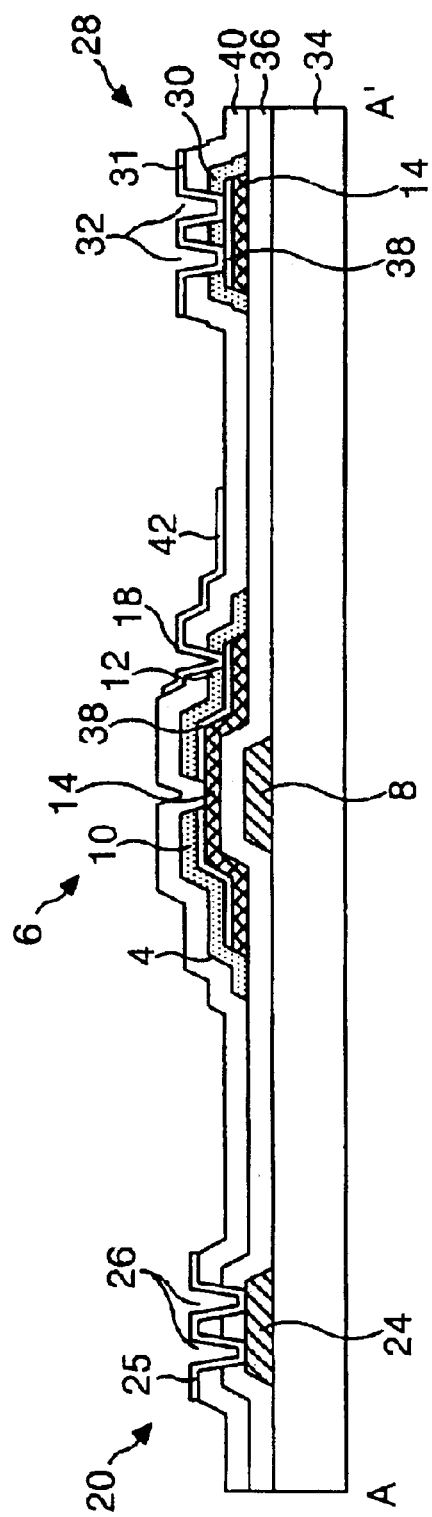
Figure 4:
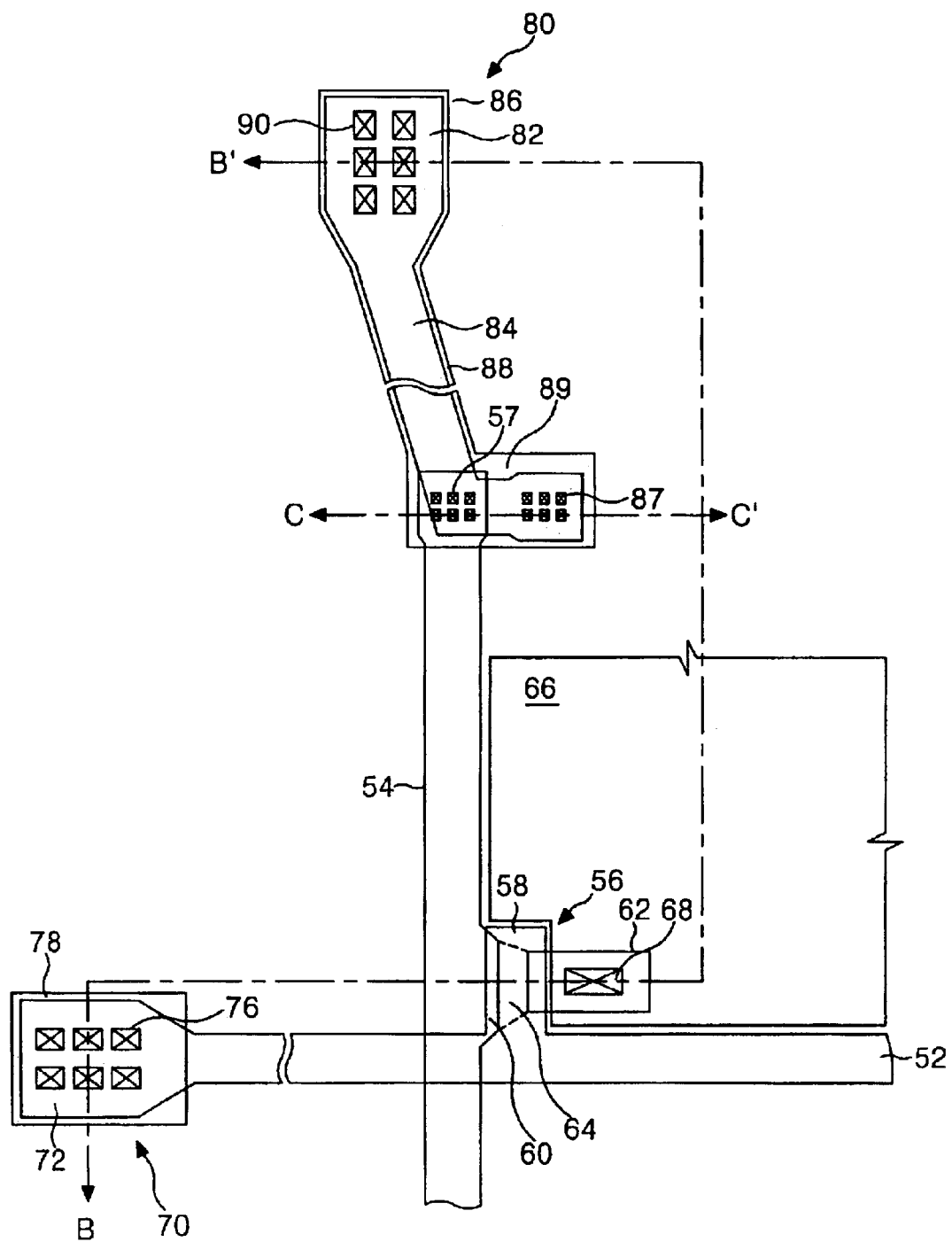
FIG. 4 is a plan view showing a portion of a thin film transistor array substrate according to an embodiment of the present invention.
Figure 5:
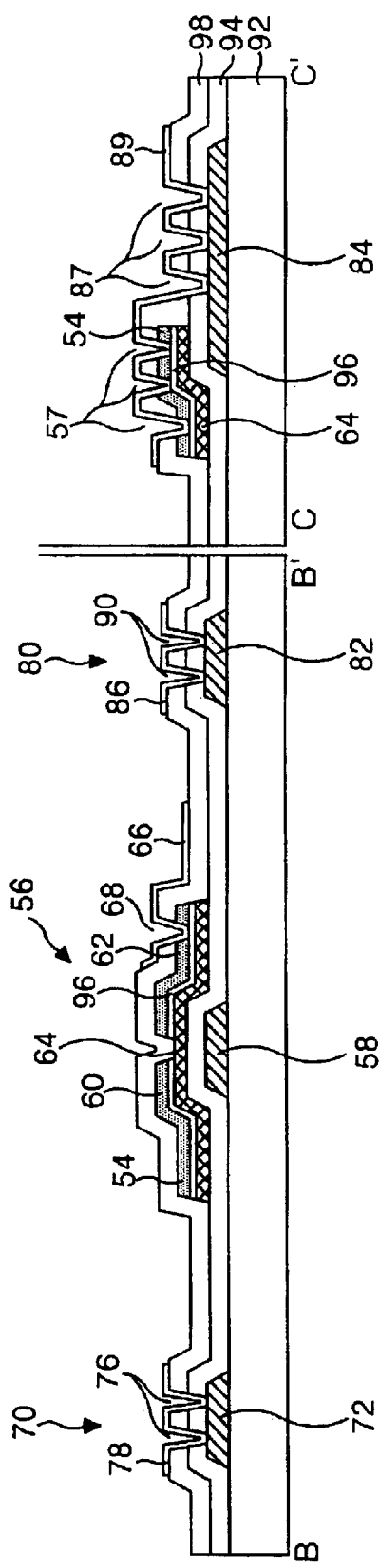
FIG. 5 is a sectional view of the thin film transistor array substrate of FIG. 4 taken along lines B–B' and C–C'.

FIG. 4 and FIG. 5 are a plan view and a sectional view showing a structure of a thin film transistor array substrate according to an embodiment of the present invention. That embodiment is beneficially fabricated using a four-round mask process. The thin film transistor array substrate includes a gate line 52 and a crossing data line 54 on a lower substrate 92. A gate insulating film 94 is disposed between the crossing lines. Additionally, a thin film transistor 56 is provided at the intersection of the crossing lines, and a pixel electrode 66 is provided at a liquid crystal cell area defined by the crossing lines.

The thin film transistor 56 includes a gate electrode 58 that is connected to the gate line 52, a source electrode 60 that is connected to the data line 54, a drain electrode 62 that is connected to the pixel electrode 66, and an active layer 64 that overlaps the gate electrode 58. The active layer is for defining a channel between the source electrode 60 and the drain electrode 62. The active layer 64 is overlapped by the data line 54, by the source electrode 60, and by the drain electrode 62. An ohmic contact layer 96 for making ohmic contacts with the data line 54, with the source electrode 60, and with the drain electrode 62 is on the active layer 64. The thin film transistor 56 allows a pixel voltage signal that is applied to the data line 54 to be selectively applied to the pixel electrode 66 in response to scanning signals applied to the gate line 52.

The pixel electrode 66 is connected, via a first contact hole 68 through a protective film 98, to the drain electrode 62. The pixel electrode 66 is for producing an electric field to a common electrode on an upper substrate (not shown) when a pixel voltage is on the pixel electrode. That electric field rotates a liquid crystal between the thin film transistor array substrate and the upper substrate owing to a dielectric anisotropy. This enables control of light from a light source that is applied to the upper substrate.

The gate line 52 is connected, via the gate pad portion 70, to a gate driver (not shown,) while the data line 54 is connected, via the data pad portion 80, to a data driver (not shown). The gate pad portion 70 is comprised of a gate pad 72 that is extended from the gate line 52, and a gate pad protection electrode 78 that is connected, via a plurality of second contact holes 76 through the gate insulating film 94 and through the protective film 98, to the gate pad 72. The data pad portion 80 is comprised of a data pad 82 that is connected, via a contact electrode 89 and via a data link portion, to the data line 54, and of a data pad protection electrode 86 that is connected, via a plurality of third contact holes 90 through the protective film 94, to the data pad 82.

The data pad 82 and a first data link 84 are formed from a gate metal layer. The first data link 84 is electrically connected via a contact electrode 89 and via fourth and fifth contact holes 57 and 87 to the data line 54. The data line 54 is formed from the source/drain metal layer. The data pad protection electrode 86 is formed from a transparent electrode layer. Also formed from the transparent electrode layer are a second data link 88 that overlaps the first data link 84 and the contact electrode 89. The protective film 98 is between the first data link 84 and the second data link 88. Such a parallel conductive structure (the first data link 84 formed from a gate metal layer and the second data link 88 formed from a transparent electrode layer) can reduce the link resistance over the single conductive structure of the prior art.

Furthermore, the data pad 82 it is in surface contact with the data pad protection electrode 86 via the third contact holes 90 that pass through the protective film 98 and through the gate insulating film 94. Thus, the contact area between the data pad 82 and the data pad protection electrode 86 is greater than in the side contacts of the prior art.

Moreover, as the data pad 82 is formed from a gate metal layer, erosion of the data pad 82 by a dry etching process can be prevented by using the fabrication process that is subsequently described. Hence defects in the data pad portion 80 can be reduced or prevented.

Hereinafter, a method of fabricating the thin film transistor array substrate shown in FIG. 4 and FIG. 5 using a four-round mask process will be described in detail with reference to FIG. 6A to FIG. 6D, which are plan views of the thin film transistor array substrate, and with reference to FIG. 7A to FIG. 7D, which are sectional views.

Referring now to FIG. 6A and to FIG. 7A, gate patterns are provided on the lower substrate 92. To do so, a gate metal layer is formed on the upper substrate 92 by a deposition technique such as sputtering. Then, the gate metal layer is patterned by photolithography using a first mask and an etching process. Each set of gate patterns includes a gate line 52, a gate electrode 58, a gate pad 72, a data pad 82, and the first data link 84. The gate metal beneficially is a single-layer or double-layer structure of chrome (Cr), molybdenum (Mo), or an aluminum group metal.

Figure 6B:
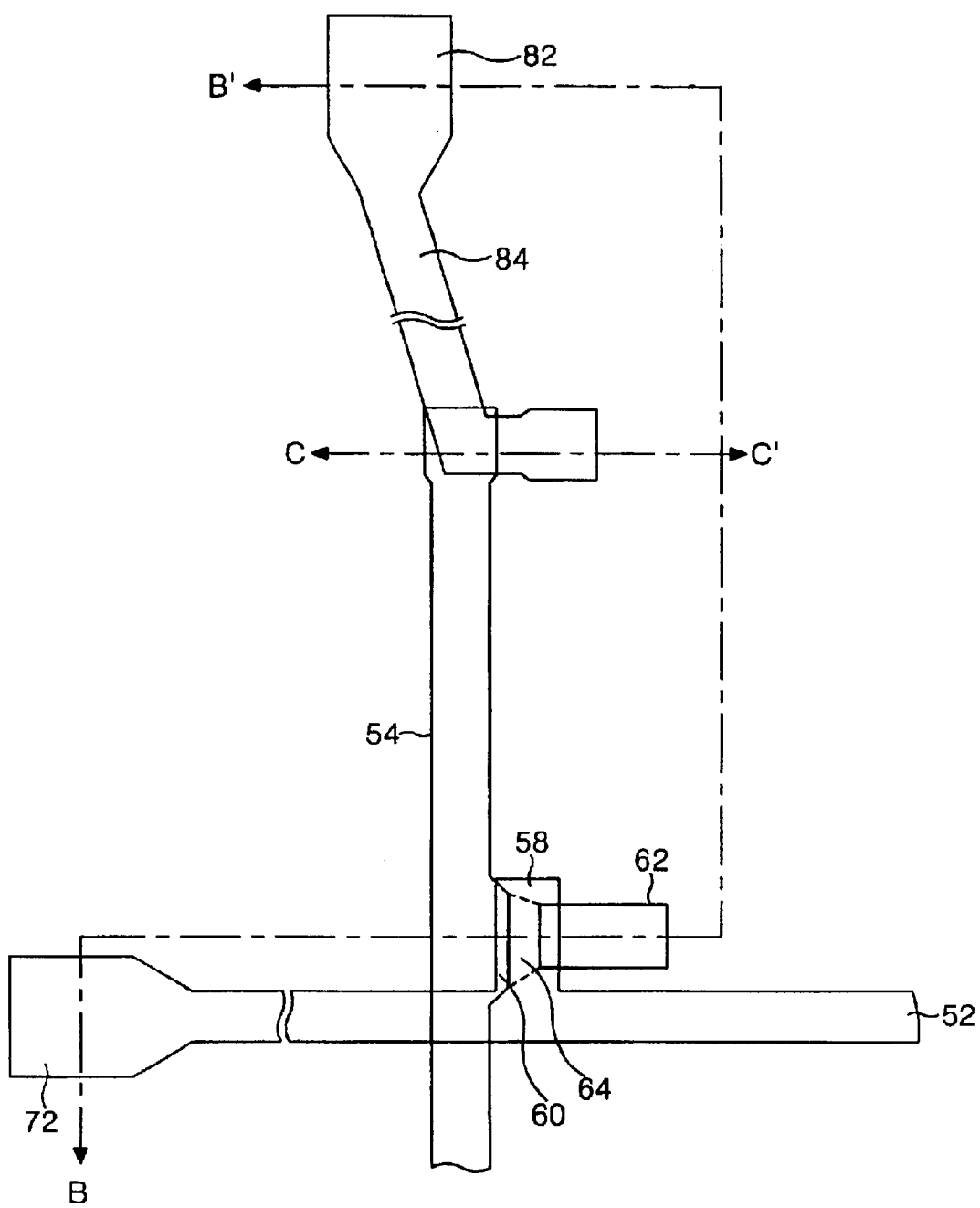

Referring now to FIG. 6B and to FIG. 7B, the gate insulating film 94, the active layer 64, the ohmic contact layer 96, and the source/drain patterns are sequentially formed on the lower substrate 92 having the gate patterns. To do so, the gate insulating film 94, an amorphous silicon layer, an n$^+$ amorphous silicon layer, and the source/drain metal layer material are sequentially disposed. Then, a photo-resist pattern is formed on the source/drain metal layer by photolithography using a second mask. The second mask is a diffractive exposure mask having a diffractive exposing part where the channel portion of the thin film transistor is to be. This enables the photo-resist pattern at the channel portion to be thinner than other places.

Subsequently, the source/drain metal layer is patterned by a wet etching process using the photo-resist pattern. This forms source/drain patterns, each of which includes a data line 54, a source electrode 60, and a drain electrode 62 that is integral with the source electrode 60. The data line 54 partially overlaps the first data link 84.

Next, the n$^+$ amorphous silicon layer and the amorphous silicon layer are patterned using a dry etching process and the same photo-resist pattern. This forms the ohmic contact layer 96 and the active layer 64.

The thin portion of the photo-resist pattern is then removed (from the channel portion) by an ashing process. Thereafter, the source/drain pattern and the ohmic contact layer 96 of the channel portion are etched by a dry etching process. Thus, the active layer 64 of the channel portion is exposed and the source electrode 60 and the drain electrode 62 are separated. The data pad 82 formed from the gate metal layer is protected by the gate insulating film 94. This prevents accidental erosion of the data pad 82 by the dry etching process. A stripping process then removes the remaining photo-resist pattern.

The gate insulating film 94 is beneficially comprised of an inorganic insulating material such as silicon nitride ($SiN_x$) or silicon oxide ($SiO_x$). The source/drain metal is beneficially comprised of molybdenum (Mo), titanium (Ti), tantalum (Ta), a molybdenum alloy, or chrome (Cr).

Referring now to FIG. 6C and to FIG. 7C, the protective film 98 with contact holes 68, 76, 90, 57, and 87 is then formed on the structure with the source/drain patterns. To do so, the protective film material is formed using a deposition technique such as plasma enhanced chemical vapor deposition (PECVD). The protective film material is then patterned by photolithography using a third mask and an etching process to define the first to fifth contact holes 68, 76, 90, 57 and 87. The first contact hole 68 passes through the protective film 98 and through the drain electrode 62. The second contact holes 76 pass through the protective film 98 and through the gate insulating film 94 to expose portions of the gate pad 72. The third contact holes 90 pass through the protective film 98 and through the gate insulating film 94 to expose the portions of the data pad 82. The fourth contact holes 57 pass through the protective film 98 and through the data line 54. The fifth contact holes 87 pass through the protective film 98 and through the gate insulating film 94 to expose portions of first data link 84. The protective film 98 is beneficially comprised of an inorganic material that is the same as the gate insulating film 94, or of an organic material having a small dielectric constant, possibly an acrylic organic compound, BCB (benzocyclobutene), or PFCB (perfluorocyclobutane).

Figure 6D:
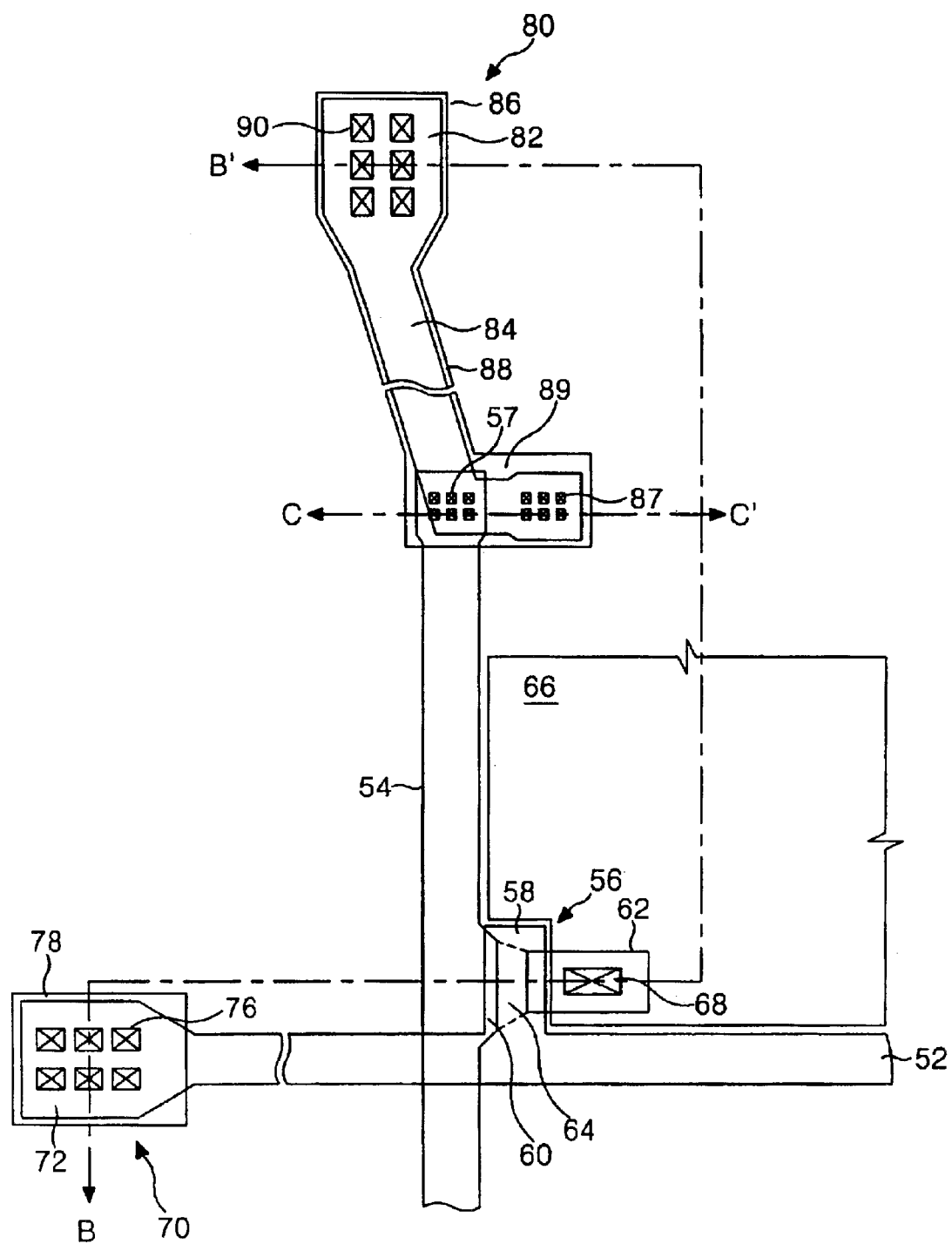

Referring now to FIG. 6D and FIG. 7D, transparent electrode patterns are then provided on the protective film 98. To do so, a transparent electrode material is deposited onto the protective film 98 by a deposition technique such as sputtering. Then, the transparent electrode material is patterned by photolithography using a fourth mask and an etching process to provide the transparent electrode patterns. Each transparent electrode pattern includes a pixel electrode 66, a gate pad protection electrode 78, a data pad protection electrode 86, a second data link 88, and a contact electrode 89.

Still referring to 6D and to FIG. 7D, the pixel electrode 66 is electrically connected, via the first contact hole 68, to the drain electrode 62. The gate pad protection electrode 78 is electrically connected, via the second contact holes 76, to the gate pad 72. The data pad protection electrode 86 is electrically connected, via the third contact holes 90, to the data pad 82. The contact electrode 89 is extended by way of the second data link 88 from the data pad protection electrode 86 and electrically connects the data line 54 to the first data link 84 through the fourth and fifth contact holes 57 and 87. The data pad protection electrode 86 is in surface contact with the data pad 82, thereby reducing contact resistance. The transparent electrode material is formed from indium-tin-oxide (ITO), tin-oxide (TO), or indium-zinc-oxide (IZO).

As described in the method of manufacturing the thin film transistor array substrate according to the present invention, the data pad 82 is formed from a gate metal layer. Thus, it is possible to prevent erosion of the data pad 82 by the dry etching process that removes the source/drain pattern and the ohmic contact layer.

Figure 8:
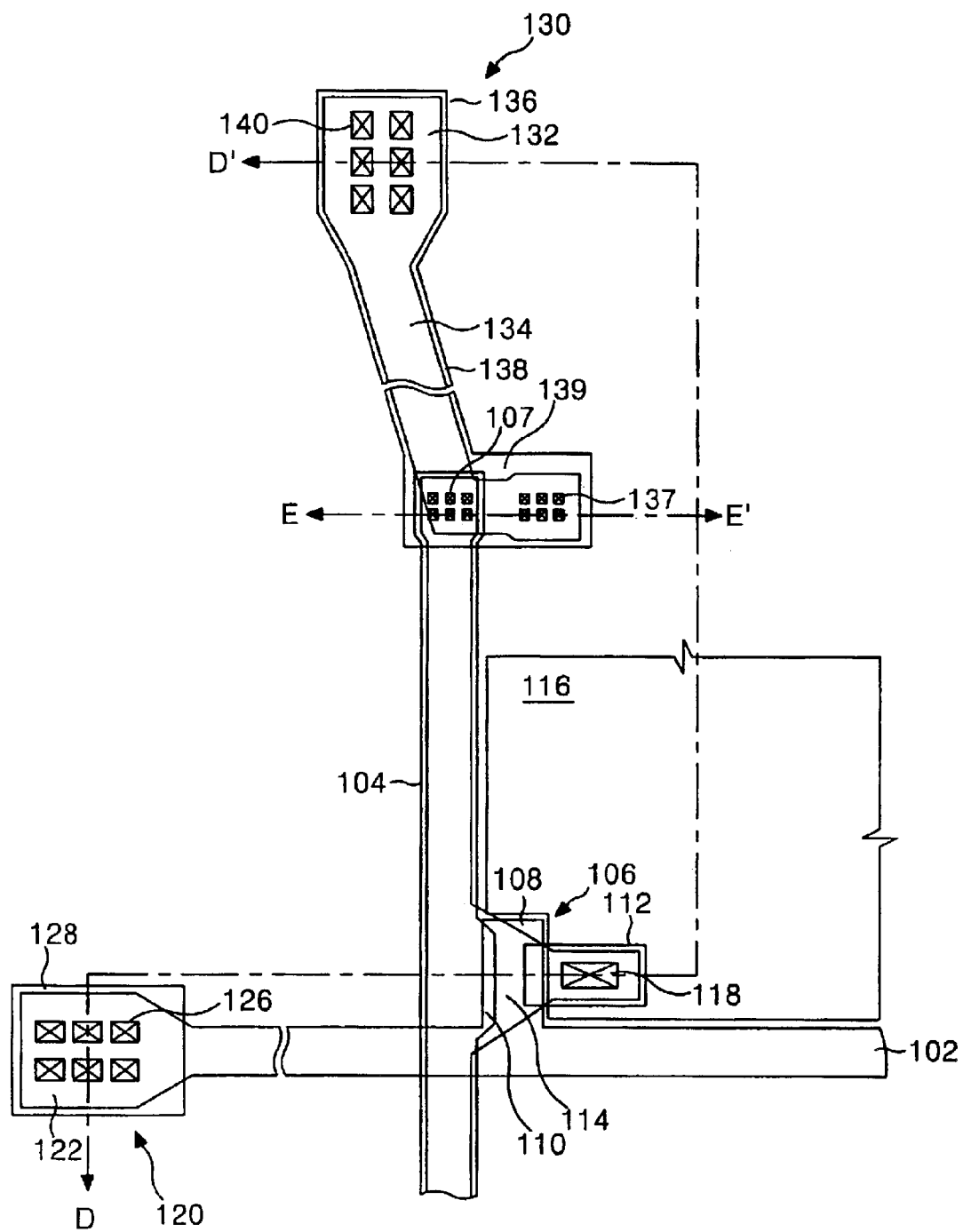
FIG. 8 is a plan view showing a structure of a thin film transistor array substrate according to another embodiment of the present invention.
Figure 9:
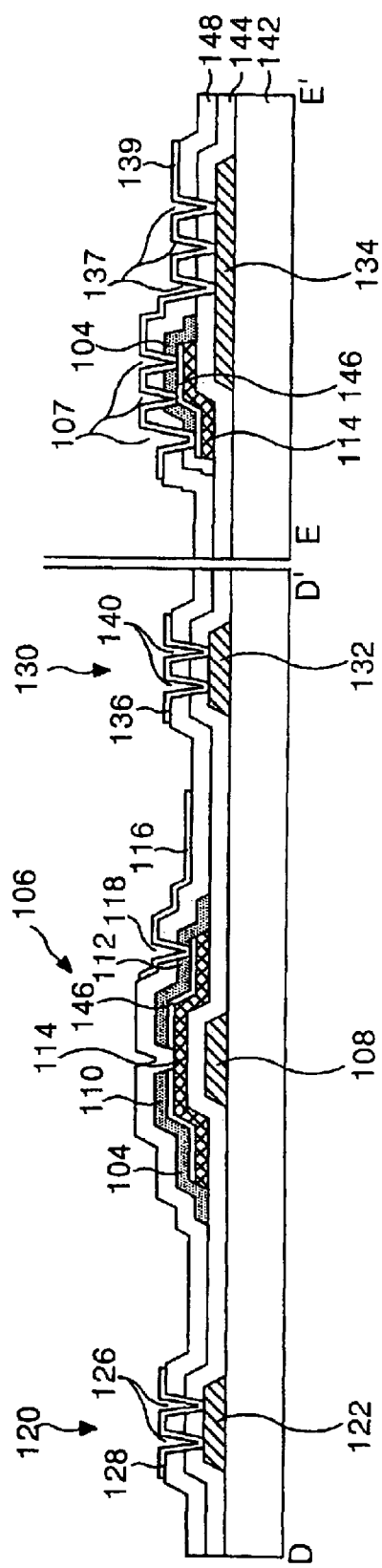
FIG. 9 is a sectional view of the thin film transistor array substrate of FIG. 8 taken along lines D–D' and E–E'.

FIG. 8 and FIG. 9 are a plan view and a sectional view showing a structure of a thin film transistor array substrate according to another embodiment of the present invention. That thin film transistor array substrate is formed using a five-round mask process. Referring to FIG. 8 and to FIG. 9, the thin film transistor array substrate includes a gate line 102 and a data line 104 on a lower substrate 142 in such a manner that they intersect each other with a gate insulating film 94 disposed between them. A thin film transistor 106 is provided at the intersection. A pixel electrode 116 is provided at a liquid crystal cell area defined by the crossing lines.

The thin film transistor 106 includes a gate electrode 108 that is connected to the gate line 102, a source electrode 110 that is connected to the data line 104, a drain electrode 112 that is connected to the pixel electrode 116, and an active layer 114 that overlaps the gate electrode 108. The active layer 114 is for providing a channel between the source electrode 110 and the drain electrode 112. The active layer 114 is overlapped by the data line 104, by the source electrode 110, and by the drain electrode 112. An ohmic contact layer 146 for making ohmic contacts with the data line 104, with the source electrode 110, and with the drain electrode 112 is provided on the active layer 114. The thin film transistor 106 allows a pixel voltage signal applied to the data line 104 to be applied to the pixel electrode 116 in response to a gate signal applied to the gate line 102.

The pixel electrode 116 is connected, via a first contact hole 118 through a protective film 148, to the drain electrode 112 of the thin film transistor 106. The pixel electrode 116 is for producing a potential difference with respect to a common electrode on an upper substrate (not shown) when a pixel voltage is applied to the pixel electrode 116. This potential difference produces an electric field that rotates a liquid crystal between the thin film transistor array substrate and the upper substrate owing to a dielectric anisotropy; This controls the light from a light source (which is not shown) that passes to the upper substrate.

The gate line 102 is connected, via the gate pad portion 120, to a gate driver (not shown), while the data line 104 is connected, via the data pad portion 130, to a data driver (not shown). The gate pad portion 120 is comprised of a gate pad 122 that is extended by way of a gate link from the gate line 102, and of a gate pad protection electrode 128 that is connected, via a plurality of second contact holes 126 through the gate insulating film 148 and through the protective film 144, to the gate pad 122. The data pad portion 130 is comprised of a data pad 132 that is connected, via a contact electrode 139 and via a data link portion, to the data line 104, and of a data pad protection electrode 136 that is connected, via a plurality of third contact holes 140 through the protective film 144, to the data pad 132.

The data pad 132 and the first data link 134 are formed from a gate metal layer. The first data link 134 is electrically connected, via the contact electrode 139 and via fourth and fifth contact holes 107 and 137, to the data line 104. The data line 104 is formed from a source/drain metal layer. The data pad protection electrode 136 is formed from a transparent electrode layer. The second data link 138 and the contact electrode 139 are also formed from the transparent electrode layer. The contact electrode overlaps the first data link 134 and is on the protective film 148. Such a parallel connection structure comprised of the first data link 134, which is formed from a gate metal layer, and the second data link 138, which is formed from a transparent metal layer, can reduce the link resistance in comparison to the single structure used in the prior art.

Furthermore, the data pad 132, which is formed from the gate metal layer, is in surface contact with the data pad protection electrode 136 via third contact holes 140 through the protective film 148 and through the gate insulating film 144. Thus, the contact area between the data pad 132 and the data pad protection electrode 136 is increased, thereby reducing contact resistance in comparison to the prior art (which used a side contact).

A method of fabricating the thin film transistor substrate shown in FIG. 8 and FIG. 9 using a five-round mask process will be described with reference to FIG. 10A to FIG. 10E, which are plan views, and to FIG. 11A to FIG. 11E, which are sectional views of the thin film transistor array substrate.

Figure 10A:
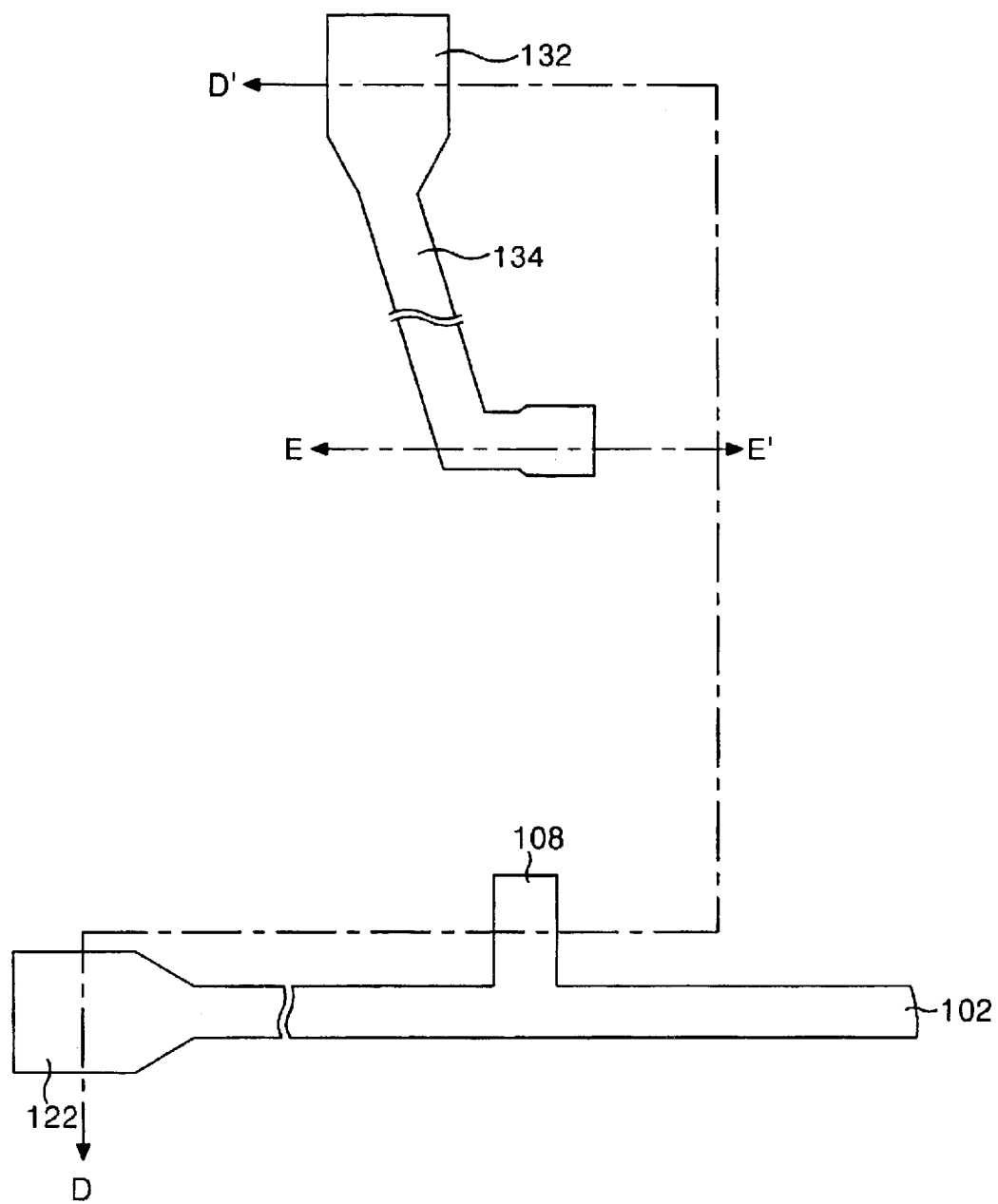
FIG. 10A to FIG. 10E are plan views that are helpful for illustrating a method of manufacturing the thin film transistor array substrate shown in FIG. 8.

Referring now to FIG. 10A and FIG. 11A, gate patterns are provided on the lower substrate 142. To do so, a gate metal layer is formed on the upper substrate 142 by a deposition technique such as sputtering. Then, the gate metal layer is patterned by photolithography using a first mask and an etching process to form gate patterns. Each gate pattern includes a gate line 102, a gate electrode 108, a gate pad 122, a data pad 132, and a first data link 134. The gate metal beneficially is a single-layer or double-layer structure of chrome (Cr), molybdenum (Mo) or an aluminum group metal.

Figure 10B:
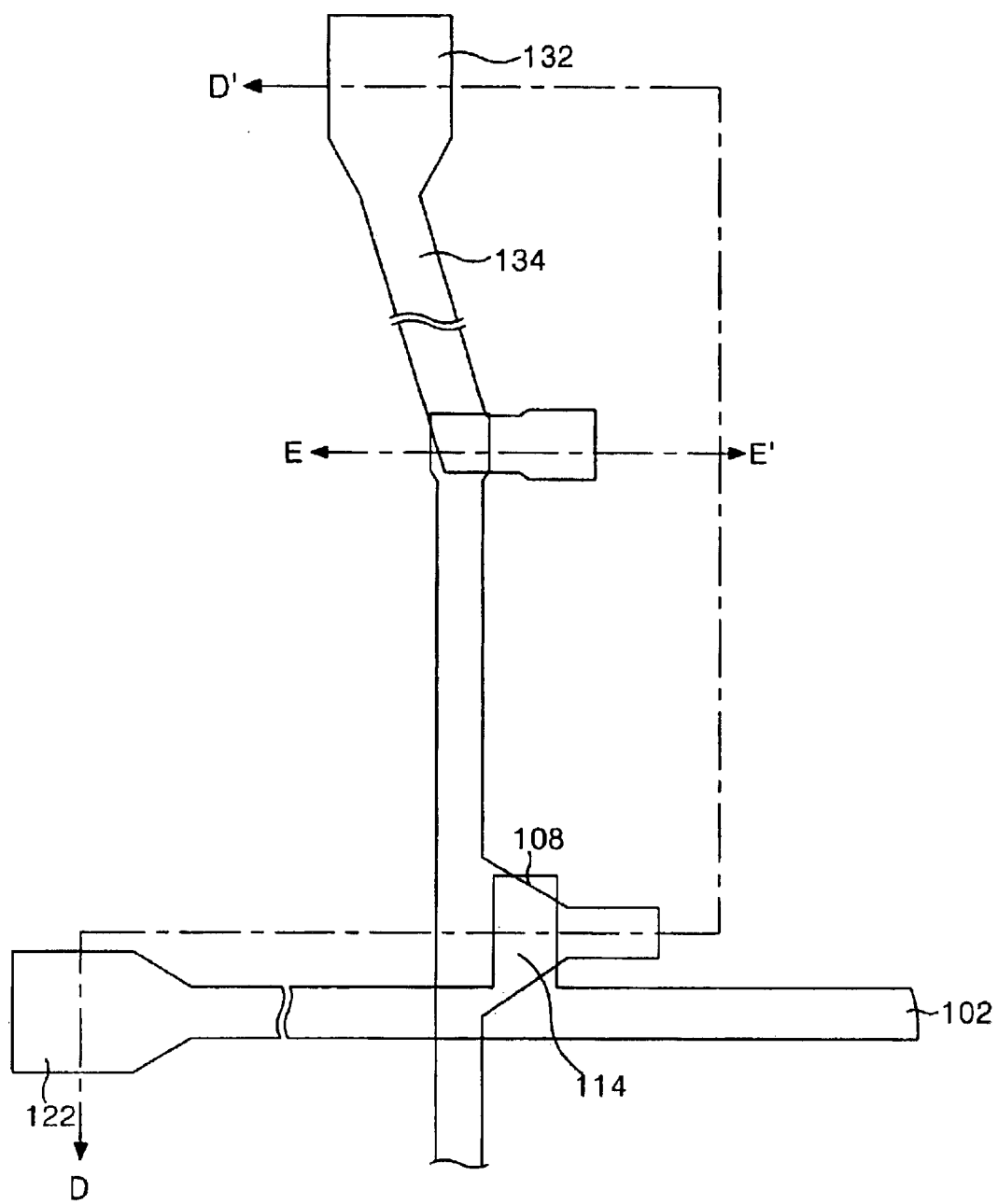

Referring now to FIG. 10B and FIG. 11B, the gate insulating film 144, the active layer 114, and the ohmic contact layer 146 are formed on the lower substrate 142 having the gate patterns. To do so, the gate insulating film 144, an amorphous silicon layer, and an n$^+$amorphous silicon layer are sequentially formed. Subsequently, the n$^+$ amorphous silicon layer and the amorphous silicon layer are etched by photolithography using a second mask and an etching process to form the ohmic contact layer and the active layer 114. The gate insulating film 144 is made from an inorganic insulating material such as silicon nitride (SiN$_x$) or silicon oxide (SiO$_x$).

Figure 10C:
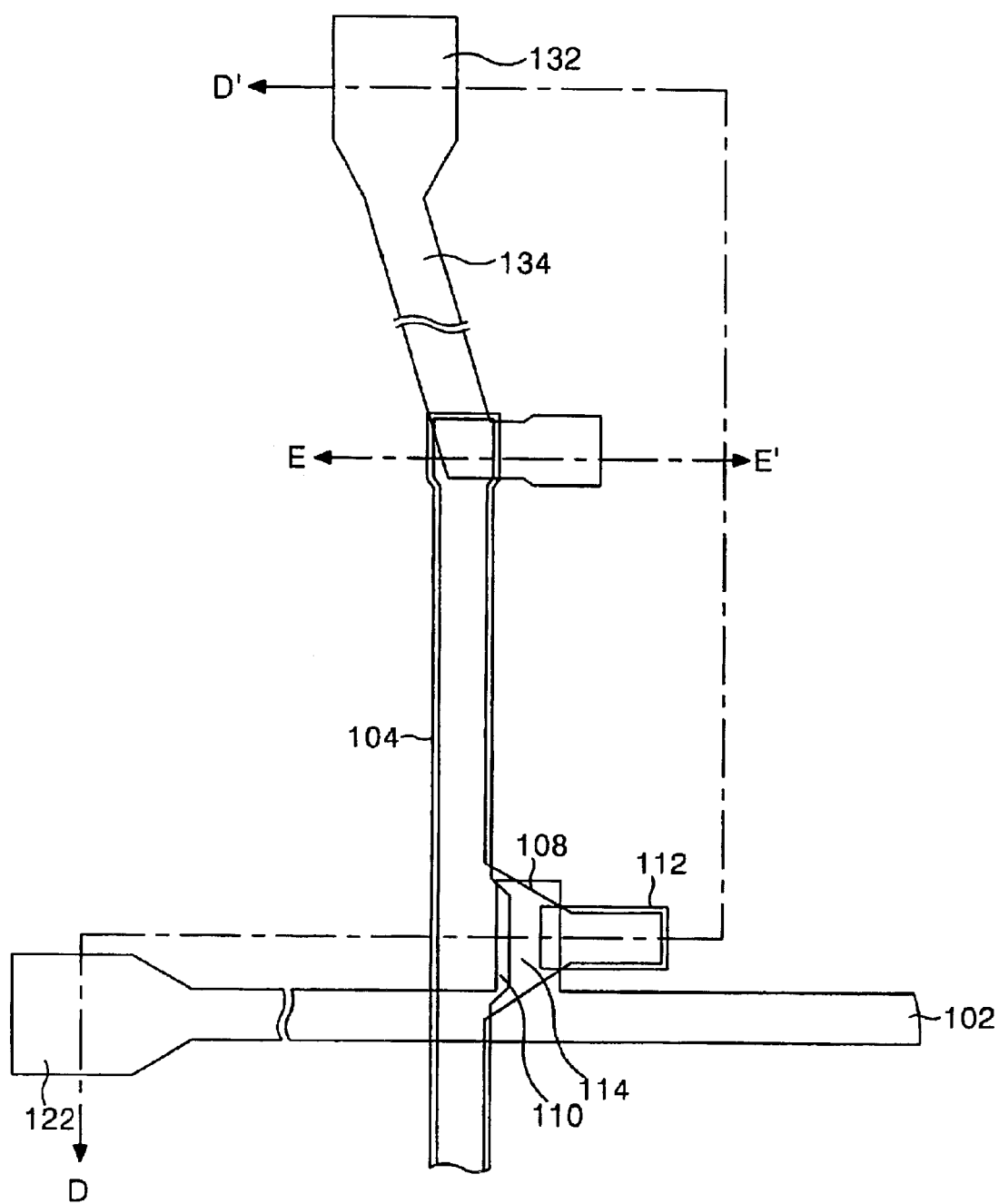

Referring now to FIG. 10C and FIG. 11C, source/drain patterns are then formed on the gate insulating film 144 provided with the active layer 114 and with the ohmic contact layer 146. To do so, a source/drain metal layer is formed by a deposition technique such as sputtering. Subsequently, the source/drain metal layer is patterned by photolithography using a third mask and an etching process to form source/drain patterns. Each source/drain pattern includes a data line 104, a source electrode 110, and a drain electrode 112. The data line 104 partially overlaps the first data link 134. Then, the ohmic contact layer 146 between the source electrode 110 and the drain electrode 112 is removed by a dry etching process. This electrically isolates the source and drain electrodes 110 and 112. The source/drain metal is beneficially comprised of molybdenum (Mo), titanium (Ti), tantalum (Ta), a molybdenum alloy, or chrome (Cr).

Figure 10D:
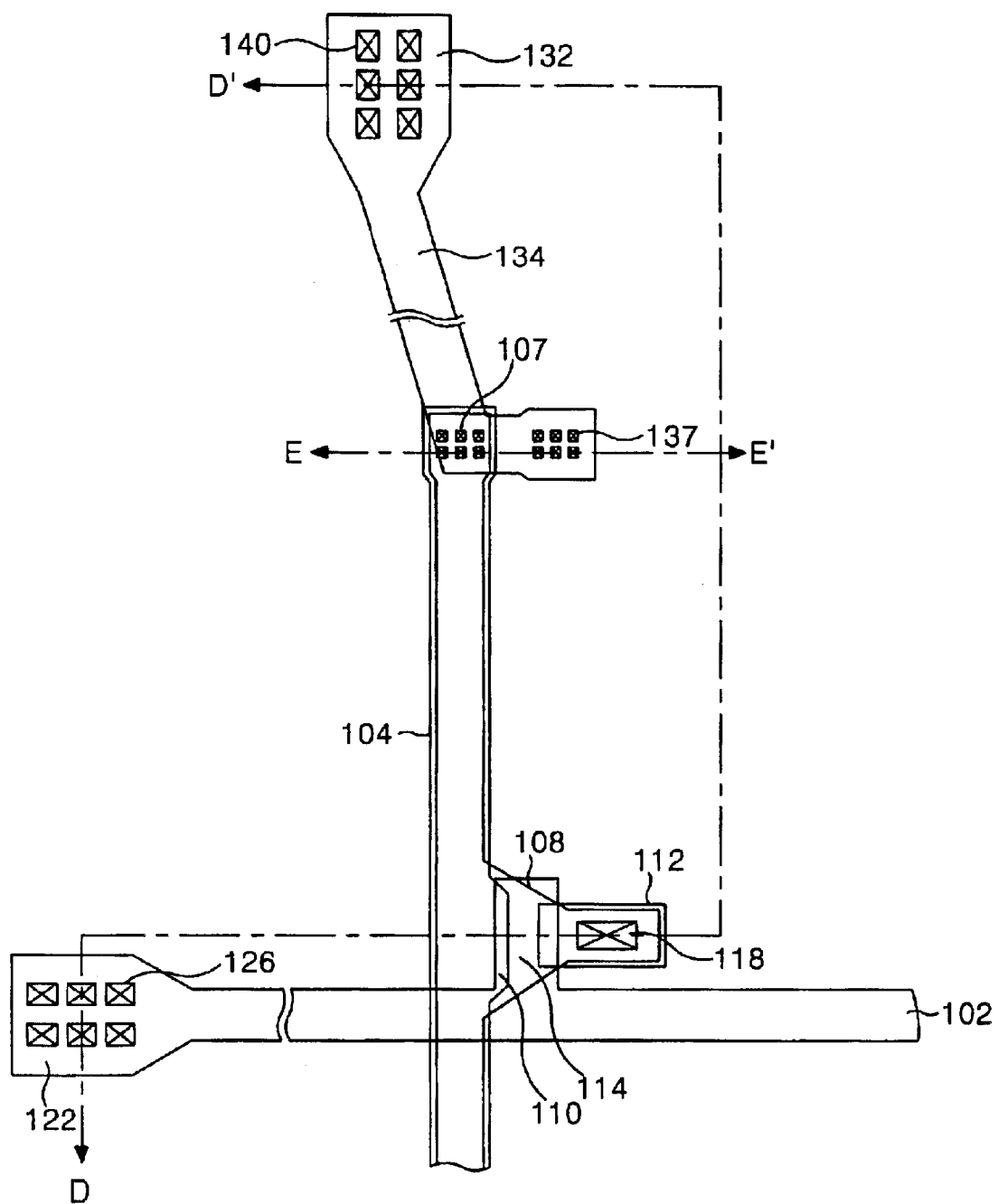

Referring now to FIG. 10D and to FIG. 11D, the protective film 148 having contact holes 118, 126, 140, 107, and 137 is then formed. To do so, a protective film material is provided over the structure having the source/drain metal layers by a deposition technique such as plasma enhanced chemical vapor deposition (PECVD). The protective film material is then patterned by photolithography using a fourth mask and an etching process to define the first to fifth contact holes 118, 126, 140, 107 and 137.

Still referring to FIG. 10D and to FIG. 11D, the first contact hole 118 passes through the protective film 148 and the drain electrode 112. The second contact holes 126 pass through the protective film 148 and through the gate insulating film 144 to expose portions of the gate pad 122. The third contact holes 140 pass through the protective film 148 and through the gate insulating film 144 to expose portions of the data pad 132. The fourth contact holes 107 pass through the protective film 148 and through the data line 104. The fifth contact holes 137 pass through the protective film 148 and through the gate insulating film 144. The protective film 148 is beneficially comprised of an inorganic material that is identical with the gate insulating film 94, or of an organic material having a small dielectric constant, such as an acrylic organic compound, BCB (benzocyclobutene), or PFCB (perfluorocyclobutane).

Figure 10E:
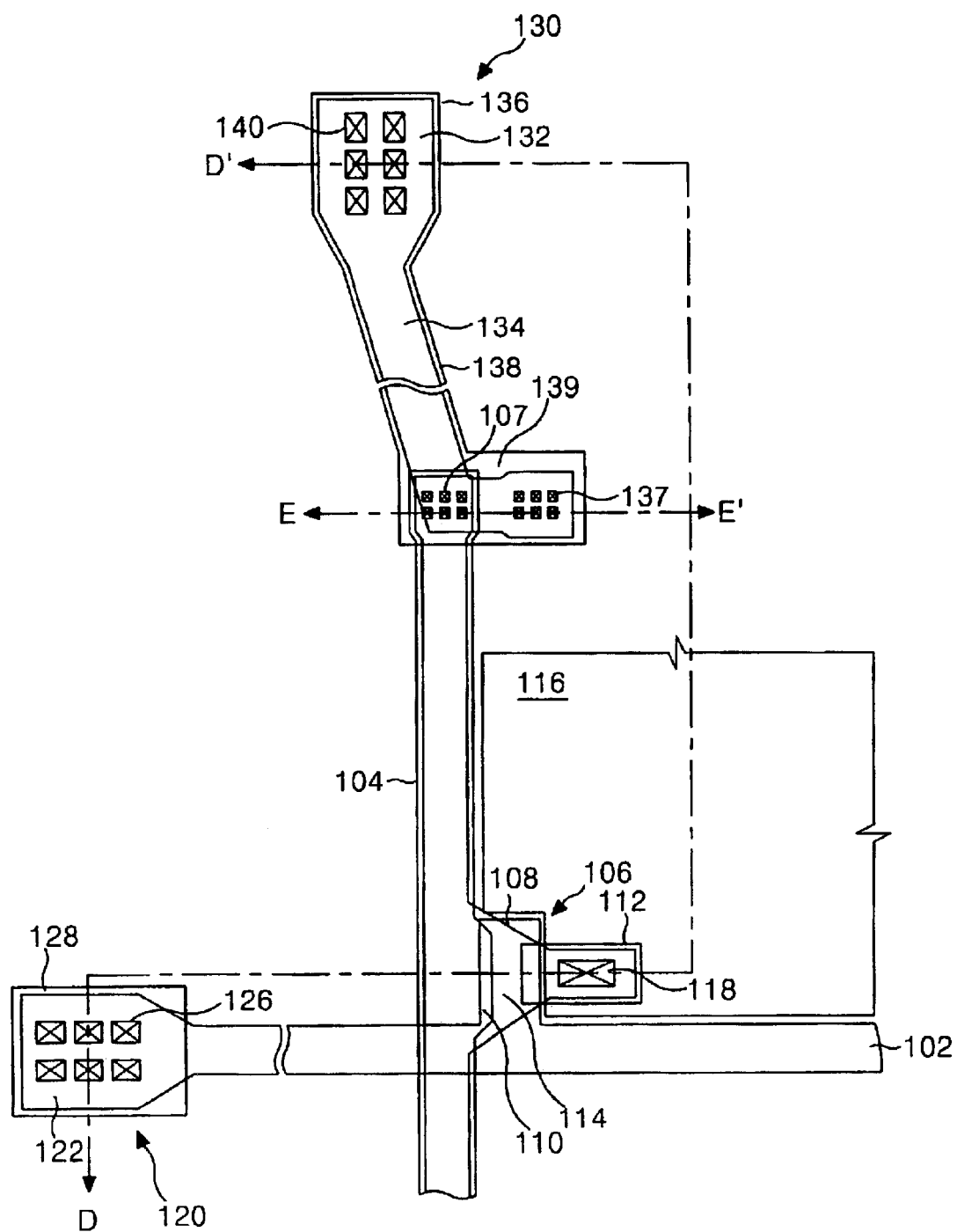

Referring to FIG. 10E and FIG. 11E, transparent electrode patterns are then provided on the protective film 148. To do so, a transparent electrode material is deposited on the structure having the protective film 148 by a deposition technique such as sputtering. Then, the transparent electrode material is patterned by photolithography using a fifth mask and an etching process to provide the transparent electrode patterns. Each transparent electrode pattern includes a pixel electrode 116, a gate pad protection electrode 128, a data pad protection electrode 136, a second data link 138 and a contact electrode 139.

Still referring to FIG. 10E and to FIG. 11E, the pixel electrode 116 is electrically connected, via the first contact hole 118, to the drain electrode 112. The gate pad protection electrode 128 is electrically connected, via the second contact holes 126, to the gate pad 128. The data pad protection electrode 136 is electrically connected, via the third contact holes 140, to the data pad 132. The contact electrode 139 is extended by way of the second data link 138 from the data pad protection electrode 136. The contact electrode 139 electrically connects the data line 104 to the first data link 134 via the fourth and fifth contact holes 107 and 137. As shown, the data pad protection electrode 136 is in surface contact with the data pad 132, thus reducing contact resistance. The transparent electrode material is formed from indium-tin-oxide (ITO), tin-oxide (TO) or indium-zinc-oxide (IZO).

As described above, according to the present invention, the data pad 132 is formed from a gate metal layer. Thus, the data pad 132 can be in surface contact with the data pad protection electrode 136 to reduce the contact resistance over that of the prior art (which used a side contact). As a result, it is possible to minimize a distortion of a pixel voltage signal caused by contact resistance.

Furthermore, according to the present invention, the data link portion adopts a parallel connection structure that is comprised of a gate metal layer and a transparent metal layer. This reduces the link resistance over the prior art that used single connection structure. As a result, the link resistance differences are reduced, thus reducing a distortion of pixel voltage signal caused by the link resistance difference.

Moreover, according to the present invention, the data pad is formed from a gate metal layer. Thus, erosion of the data pad can be prevented when a dry etching process removes the source/drain patterns and the ohmic contact layer. As a result, it is possible to reduce data pad defects, thereby improving manufacturing yield.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of manufacturing a thin film transistor array substrate of a liquid crystal display, comprising the steps of:

(A) forming on a substrate a gate line and a crossing data line that are separated by a gate insulating film, a thin film transistor adjacent to the crossing, a gate link and a gate pad that extends from the gate line, a data pad under the gate insulating film, and a data link that extends from the data pad toward the data line;

(B) forming a protective film over the entire surface of the substrate after completing step (A);

(C) defining a plurality of first contact holes and second contact holes through the protective film and through the gate insulating film; wherein the first contact holes expose the data link, and wherein the second contact holes expose the data pad;

(D) defining a plurality of third contact holes through the protective film, wherein the third contact holes expose the data line;

(E) forming a pixel electrode that is electrically connected to the thin film transistor and a data pad protection electrode that is connected to the data link via the first contact holes, to the data pad via the second contact holes, and to the data line via the third contact holes.

2. The method as claimed in claim 1, wherein step (A) includes:

depositing a gate metal material onto the substrate and then patterning the gate metal material to form a gate electrode of the thin film transistor, the gate line, the gate pad, the data pad and the data link;

forming the gate insulating film;

depositing a semiconductor material on the gate insulating film and then patterning the semiconductor material to form an active layer;

depositing a semiconductor material on the active layer and then patterning the semiconductor material to form an ohmic contact layer of the thin film transistor; and depositing a drain metal material over the semiconductor material and the gate insulating film, and then patterning the drain metal material to form the data line and source and drain electrodes of the thin film transistor.

3. The method as claimed in claim 1, wherein the step of forming the data pad protection electrode includes forming the data pad protection electrode from the same material as the pixel electrode.

4. The method as claimed in claim 3, wherein the step of forming the data pad protection electrode includes forming the data pad protection electrode from a transparent material.

5. The method as claimed in claim 4, wherein the step of forming the data pad protection electrode includes forming the data pad protection electrode from a material selected from the group consisting of ITO, TO, IZO, and combinations thereof.

6. The method as claimed in claim 1, wherein the step of forming the data line includes forming the data line from molybdenum.

7. The method as claimed in claim 1, wherein the step of forming the third contact holes includes forming the third contact holes through the data line such that the data line is exposed through the sides of the third contact holes, and wherein the step of forming the data pad protection electrode includes forming the data pad protection electrode in electrical contact with the data line along the sides of the third contact holes.

* * * * *